(12) United States Patent
Haney et al.

(10) Patent No.: US 10,179,729 B2
(45) Date of Patent: *Jan. 15, 2019

(54) HERMETIC ENCAPSULATION FOR MICROELECTROMECHANICAL SYSTEMS (MEMS) DEVICES

(71) Applicant: INTEL CORPORATION, Santa Clara, CA (US)

(72) Inventors: Sarah K. Haney, Cary, NC (US); Weng Hong Teh, Cambridge, MA (US); Feras Eid, Chandler, AZ (US); Sasha N. Oster, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/005,826

(22) Filed: Jan. 25, 2016

(65) Prior Publication Data

US 2017/0022050 A1 Jan. 26, 2017

Related U.S. Application Data

(63) Continuation of application No. 14/137,538, filed on Dec. 20, 2013, now Pat. No. 9,242,854.

(51) Int. Cl.
*B81B 7/00* (2006.01)
*B81C 1/00* (2006.01)

(52) U.S. Cl.
CPC ......... *B81B 7/0041* (2013.01); *B81B 7/0032* (2013.01); *B81C 1/00293* (2013.01); *B81C 1/00539* (2013.01); *B81B 2203/0315* (2013.01); *B81B 2207/012* (2013.01); *B81B 2207/07* (2013.01); *B81C 2201/013* (2013.01);
(Continued)

(58) Field of Classification Search
CPC .. B81C 1/00539; B81B 7/0032; B81B 3/0021
See application file for complete search history.

(56) References Cited

U.S. PATENT DOCUMENTS 9,242,854 B2 * 1/2016 Haney ................ B81C 1/00539
2013/0270660 A1 * 10/2013 Bryzek .................. H01L 29/84
257/418
2014/0159228 A1 6/2014 Teh et al.
(Continued)

*Primary Examiner* — Mohammad M Choudhry
(74) *Attorney, Agent, or Firm* — Schwabe, Williamson & Wyatt, P.C.

(57) ABSTRACT

Embodiments of the invention describe hermetic encapsulation for MEMS devices, and processes to create the hermetic encapsulation structure. Embodiments comprise a MEMS substrate stack that further includes a magnet, a first laminate organic dielectric film, a first hermetic coating disposed over the magnet, a second laminate organic dielectric film disposed on the hermetic coating, a MEMS device layer disposed over the magnet, and a plurality of metal interconnects surrounding the MEMS device layer. A hermetic plate is subsequently bonded to the MEMS substrate stack and disposed over the formed MEMS device layer to at least partially form a hermetically encapsulated cavity surrounding the MEMS device layer. In various embodiments, the hermetically encapsulated cavity is further formed from the first hermetic coating, and at least one of the set of metal interconnects, or a second hermetic coating deposited onto the set of metal interconnects.

18 Claims, 21 Drawing Sheets

(52) U.S. Cl.
CPC ............... *B81C 2203/0109* (2013.01); *B81C 2203/0136* (2013.01); *B81C 2203/0792* (2013.01)

(56) References Cited

U.S. PATENT DOCUMENTS

2014/0203379 A1    7/2014   Teh et al.
2014/0217599 A1    8/2014   Teh et al.

* cited by examiner

HERMETIC ENCAPSULATION FOR MICROELECTROMECHANICAL SYSTEMS (MEMS) DEVICES

RELATED CASES

This application is a continuation of and claims the benefit of U.S. patent application Ser. No. 14/137,538, titled "HERMETIC ENCAPSULATION FOR MICROELECTRO-MECHANICAL SYSTEMS (MEMS) DEVICE", filed Dec. 20, 2013, which is incorporated by reference in its entirety.

TECHNICAL FIELD

Embodiments of the invention are in the field of semiconductor packages and, in particular, related to hermetic encapsulation for microelectromechanical systems (MEMS) devices.

BACKGROUND

A microelectromechanical systems (MEMS) device is a microdevice that integrates mechanical and electrical elements on a common substrate using microfabrication technology. The electrical elements are formed using known integrated circuit fabrication technology. The mechanical elements are fabricated using lithographic processes that micromachine a substrate to selectively etch away portions of the substrate. Additional layers are often added to the substrate and then micromachined until the MEMS device is in a desired configuration. MEMS devices may include actuators, sensors, switches, etc.

It is ideal for a MEMS device to be in a hermetic environment to reduce its exposure to moisture and contaminants; however, current solutions fail to completely encapsulate the MEMS device, thereby exposing it to some moisture and contaminants over time.

BRIEF DESCRIPTION OF THE DRAWINGS

Non-limiting and non-exhaustive embodiments of the disclosure are described with reference to the following figures, wherein like reference numerals refer to like parts throughout the various views unless otherwise specified.

DESCRIPTION OF THE EMBODIMENTS

Figure 1A:
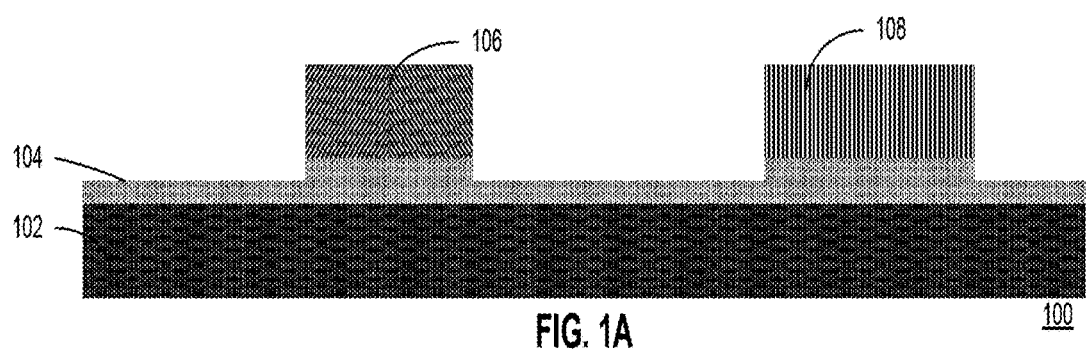
FIG. 1A-1L illustrate cross-sectional views of various operations of a process for fabricating a hermetic encapsulation structure according to an embodiment of the invention.

Embodiments of the invention describe hermetic encapsulation for a microelectromechanical systems (MEMS) device. In the following description, numerous specific details are set forth, such as packaging architectures, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

As referred to herein, a MEMS device is a micro or nano device that integrates mechanical and electrical elements on a common substrate, typically using microfabrication technology. The mechanical elements may be fabricated using lithographic processes on a substrate, to selectively pattern the devices according to known techniques. Additional layers are often added to the substrates and then micromachined until the MEMS device is in a designed configuration. MEMS devices may include, for example, actuators, sensors, switches, accelerometers, modulators and optical devices.

MEMS actuating or sensing components may be fabricated based on packaging build up layers, such as bumpless build-up layer (BBUL) packaging. The integration of BBUL MEMS sensors/actuators with BBUL build up packaging technology presents a significant challenge for MEMS device encapsulation in a packaging architecture. This encapsulation is critical in providing protection from moisture (i.e., from the organic constituents which are prevalent in packaging materials) and contaminants; furthermore, this encapsulation further protects the headspace required for actuation of moveable parts of the MEMS device. Building monolithic MEMS as part of the package build-up layers allows for integration of the encapsulation into the MEMS device fabrication process flow. This encapsulation process provides hermetic protection to the MEMS device while avoiding process temperatures or conditions that could degrade MEMS device performance and reliability.

As described below, embodiments of the invention describe processes to create encapsulation structures during the packaging process (i.e., at the panel level) to provide hermetic protection for MEMS actuating or sensing components. Embodiments of the invention describe various processes for attaching a hermetic structure (such as a metal plate or a silicon/glass interposer) over a formed MEMS device layer to at least partially form a hermetically encapsulated cavity surrounding the MEMS device layer. This hermetically encapsulated cavity is further formed from a first silicon nitride (SiN) layer, and either a set of metal interconnects, or a second SiN layer deposited onto the set of metal interconnects. These solutions provide hermetic encapsulation as well as protect the device from subsequent processing, singulation and packaging.

FIG. 1A-1L illustrate cross-sectional views of various operations of a process for fabricating a hermetic encapsulation structure according to an embodiment of the invention. FIG. 1A illustrates stack 100 including copper panel 102 and adhesive layer 104. Magnet 106 (used for MEMS actuating components, such as sensors) and integrated circuit (IC) die 108 are fixed to stack layer via adhesive layer 104. Adhesive layer 104 can be either applied to the panel (as shown) or to the backs of the components to be attached such as the magnet and the IC die.

Figure 1B:
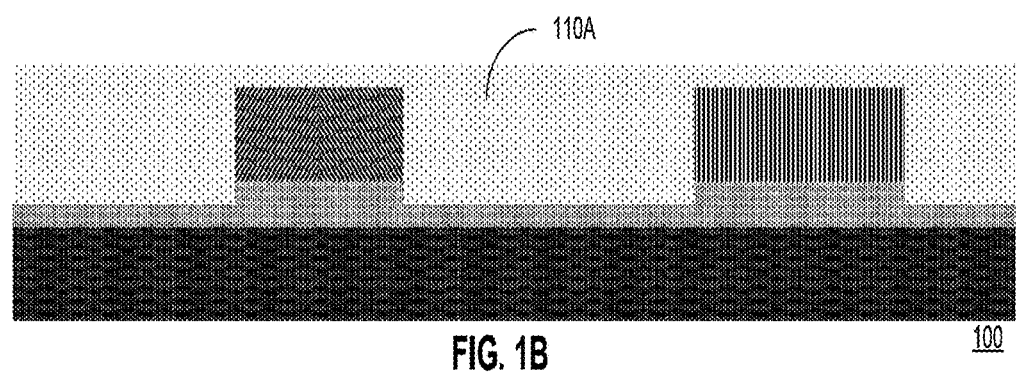

FIG. 1B illustrates laminate organic dielectric film 110A deposited on stack 100. Film 110A may comprise any laminate formed from organic dielectric materials, such as Ajinomoto build-up film (ABF), epoxy, polyimide, etc.

Figure 1C:
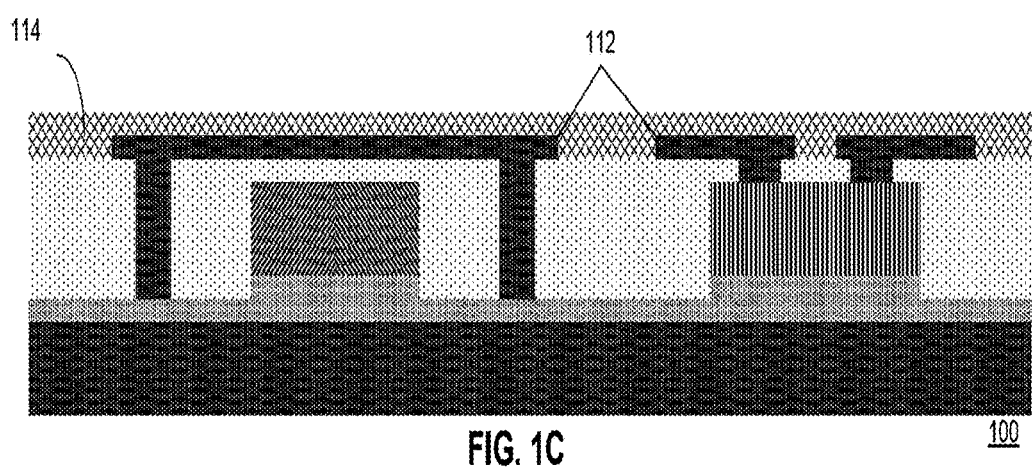

FIG. 1C illustrates stack 100 after vias 112 are formed and filled by executing any known via hole drilling and electroplating processes. Furthermore, SiN layer 114 is deposited. In embodiments of the invention, SiN is deposited at a low temperature using a plasma enhanced chemical vapor deposition (PECVD) process; the low temperature helps prevent any degradation of the organic dielectric layers. As described below, SiN layer 114 is used to at least partially form the eventual MEMS hermetic encapsulation structure. SiN is used in this example because of its high covalent bond density, its optical adhesion to underlying layers, and its properties as a pinhole free, conformal and high density film, its transparency at certain thicknesses, and the ability to tune the mechanical properties of the material with deposition parameters. Other materials, such as SiN derivatives, silicon dioxide (SiO2) or silicon oxynitride (SiON) may be used in other embodiments of the invention.

Figure 1D:
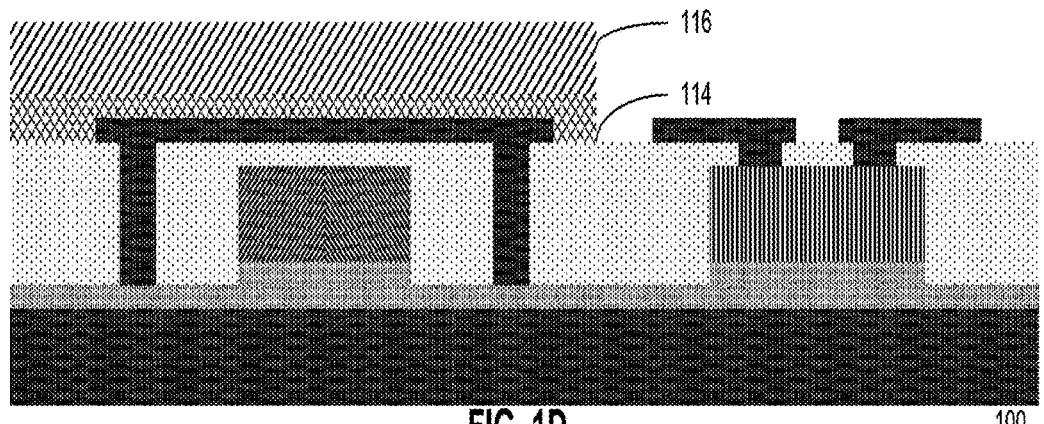

FIG. 1D illustrates stack 100 after photoresist layer 116 is deposited to protect a portion of SiN layer 114 during a subsequent plasma etch process. As illustrated in this figure, SiN layer 114 is etched so that the remaining portion of the layer is disposed over the eventual MEMS layer.

Figure 1E:
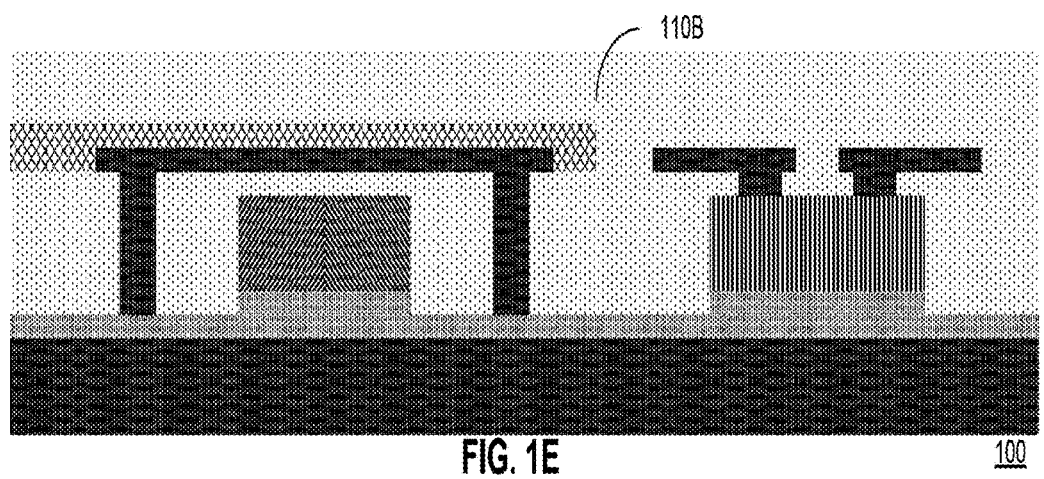
Figure 1F:
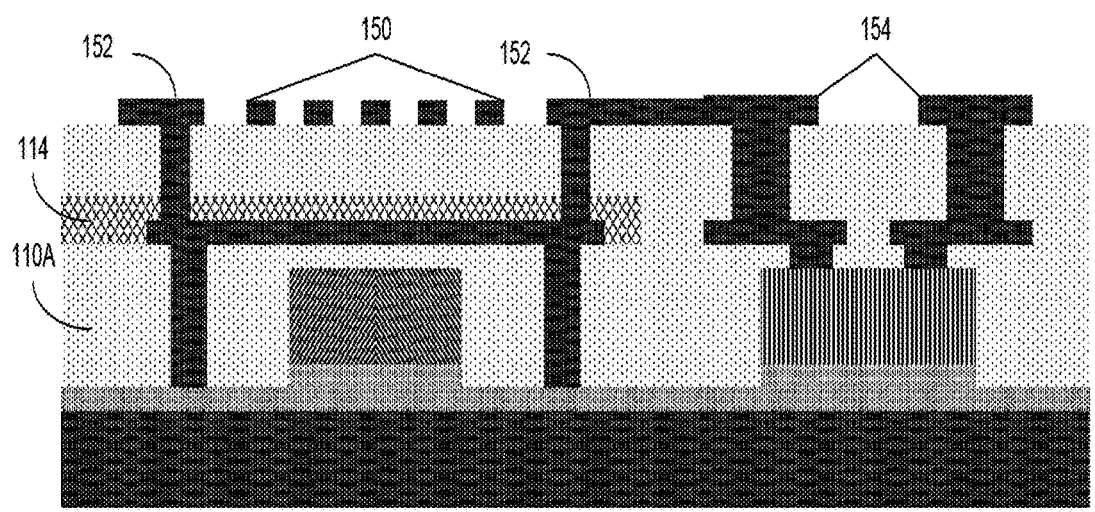

FIG. 1E illustrates subsequent laminate organic dielectric film layer 110B deposited over stack 100. FIG. 1F illustrates that MEMS layer 150 (including, for example, actuating components of the eventual MEMS device) and copper pads 152 and 154 are formed from a via hole drilling and electroplating processes. This figure illustrates SiN layer 114 is disposed below MEMS layer 150, thereby providing partial hermetic protection for the MEMS layer (i.e., to protect from moisture and/or containments from the environment or through organic dielectric film 110A), as described below.

Figure 1G:
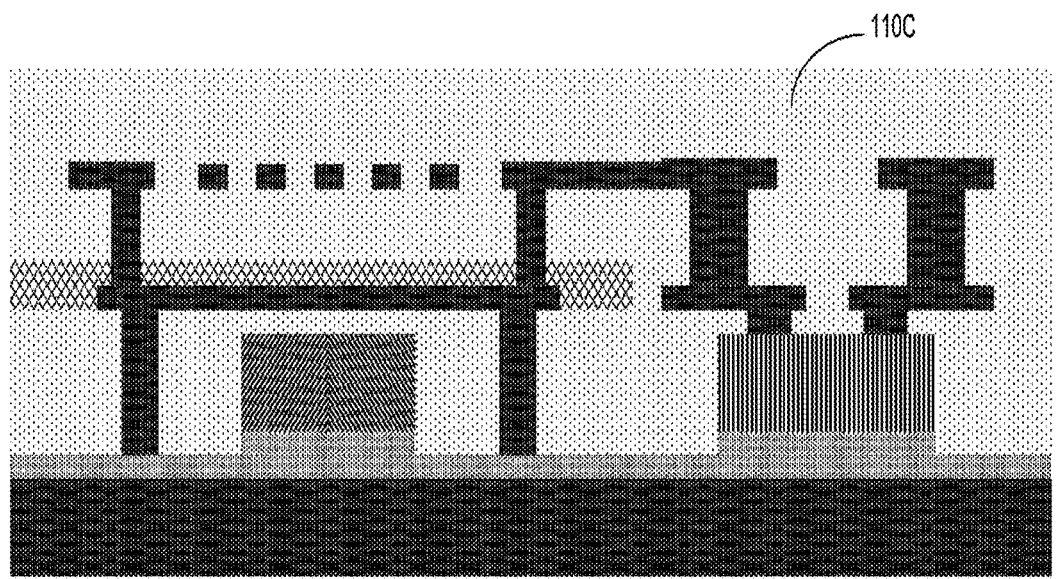
Figure 1H:
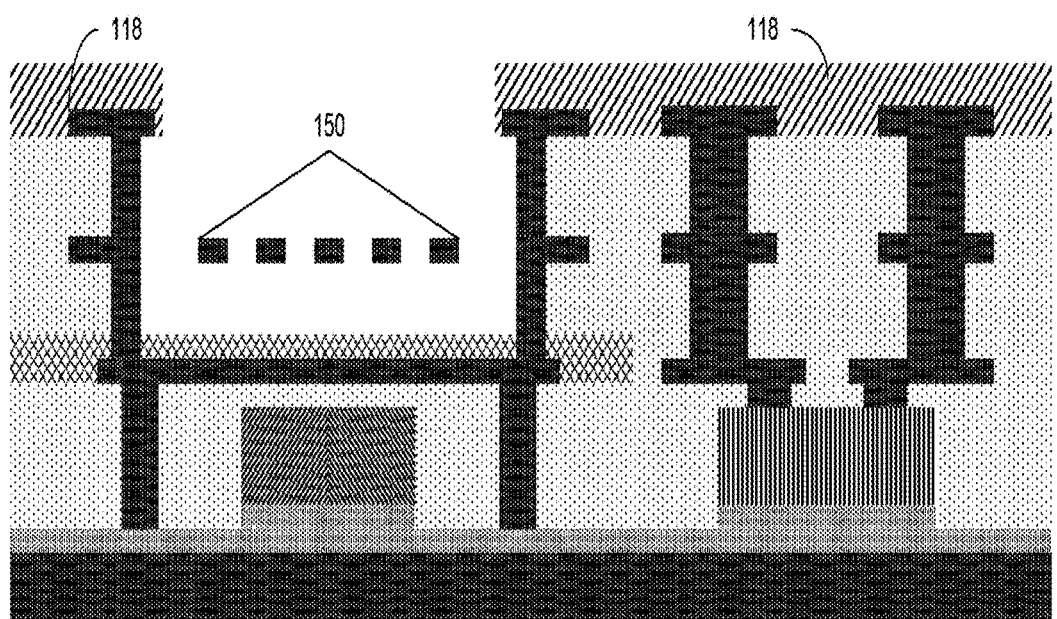

FIG. 1G illustrates subsequent laminate organic dielectric film layer 110C deposited over stack 100. FIG. 1H illustrates photoresist layer 118 being selectively deposited over stack 100 to expose MEMS layer 150; a reactive ion etching or oxygen plasma release process is performed to remove a portion of the organic dielectric film layers to release MEMS layer 150.

Figure 1I:
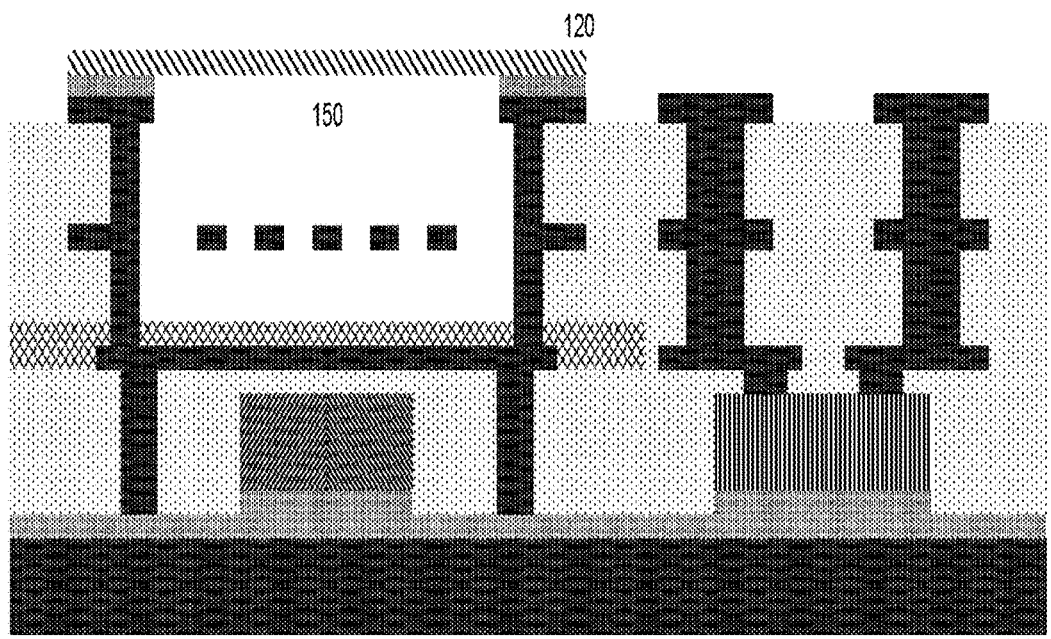

FIG. 1I illustrates that photoresist layer 118 of FIG. 1H is stripped and metal plate 120 is bonded/attached over MEMS layer 150 to provide mechanical support for the MEMS layer. In some embodiments, a mesh layer is used rather than metal plate 120. Mesh layers may comprise metal, carbon, or other rigid materials. In embodiments of the invention, mesh layers do not necessarily have to be insulating or conducting, the layers simply provide mechanical support and are rigid enough to protect the active MEMs layers. The mesh layers may be processed using a pick and place method similar to a metal plate. Depending on the hole size of the mesh layer, encapsulation may be achieved through the subsequent SiN deposition 124 or through leaving resist layer 122 over the mesh area, which would then be covered by dielectric layer 124. As described below, in this embodiment, metal plate 120 is to be subsequently covered by a hermetic layer, and thus may be bonded via a non-hermetic bonding material.

Figure 1J:
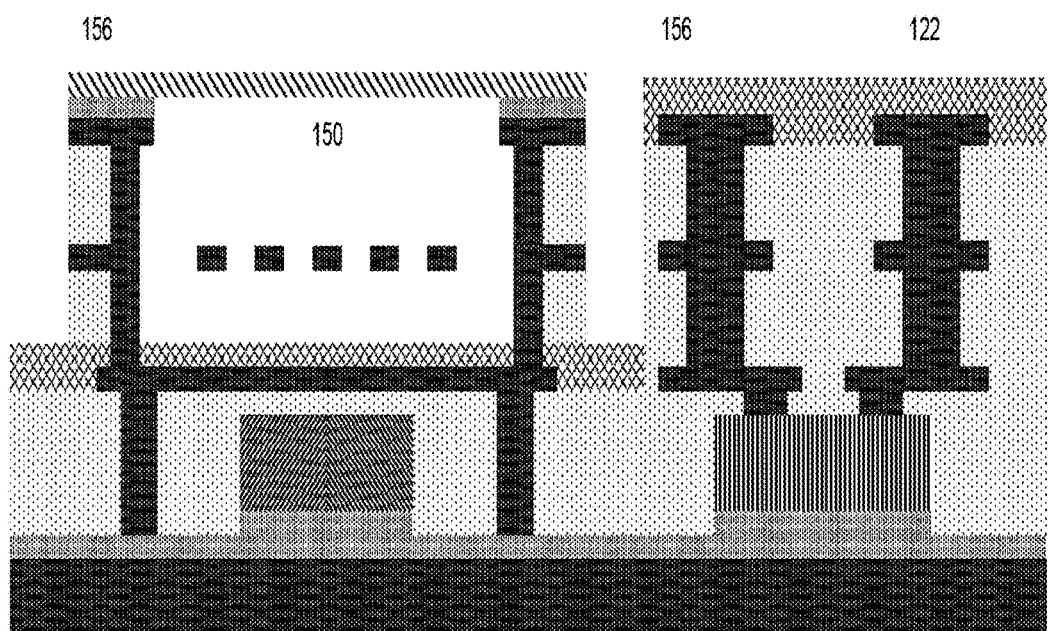

FIG. 1J illustrates photoresist layer 122 is deposited over the stack buildup of IC die 108, to protect this region of stack 100 from the organic dielectric etch process performed to create regions 156 around MEMS layer 150.

Figure 1K:
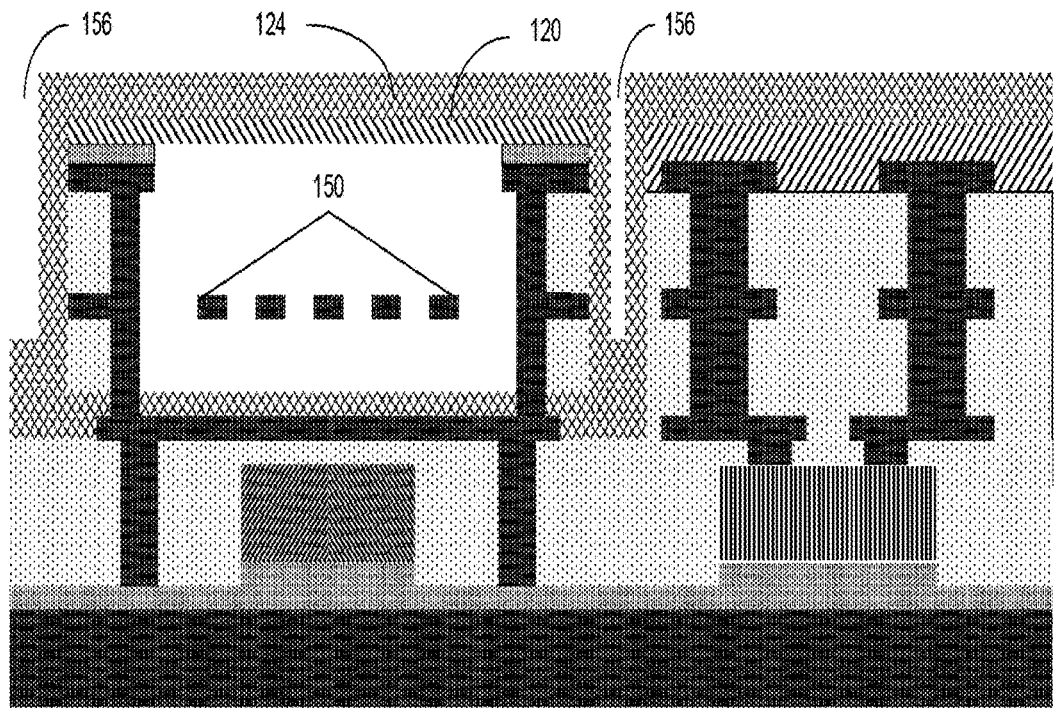
Figure 1L:
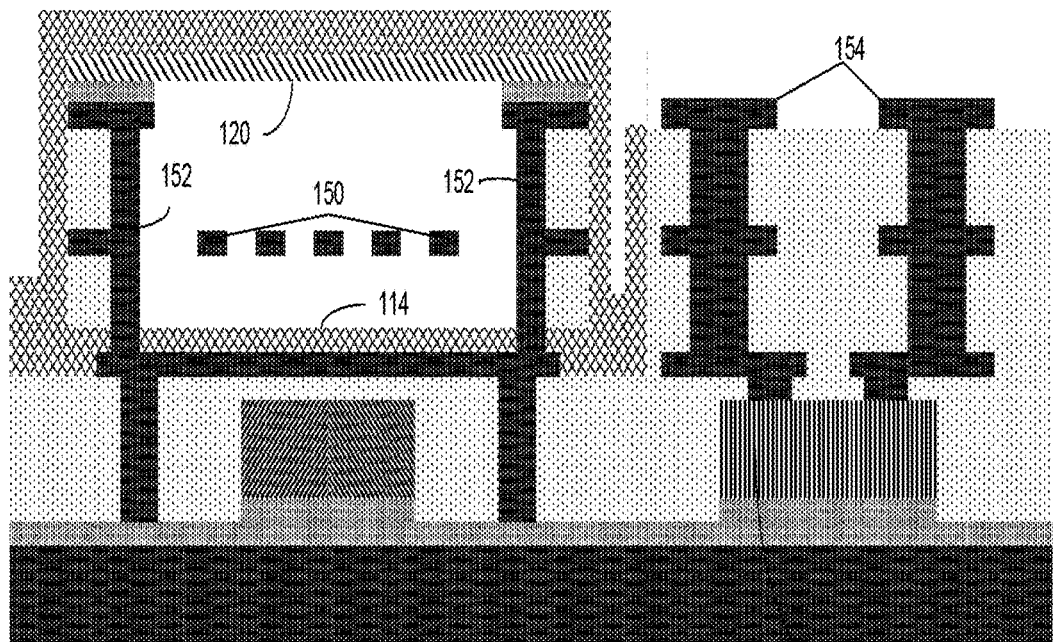

FIG. 1K illustrates SiN layer 124 deposited over stack 100 to cover metal plate 120 and to further line regions 156 around MEMS layer 150. FIG. 1L illustrates that SiN and photoresist layers over (the stack buildup of) IC die 108 from FIG. 1K are removed to expose copper pads 154. As shown in this illustration, MEMS layer 150 is hermetically encapsulated from any organic layers via SiN layer 114 and metal plate 120, along with copper pads/posts 152. Thus, the operations illustrated in FIG. 1A-1L describe an exemplary method to create encapsulation structures during the packaging process (i.e., at the wafer level) to provide hermetic protection for MEMS actuating or sensing components. Alternative operations according to various embodiments of the invention are further described below.

Furthermore, process flows as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the disclosure; thus, not all actions are required in every implementation. Other process flows are possible.

Figure 2A:
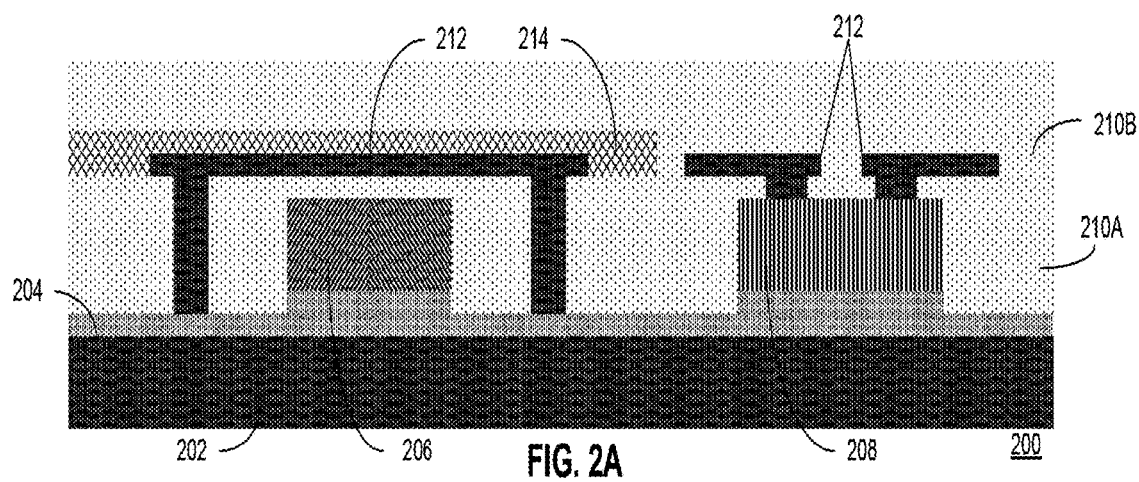
FIG. 2A-2M illustrate cross-sectional views of various operations of a process for fabricating a hermetic encapsulation structure according to an embodiment of the invention.

FIG. 2A-2M illustrate cross-sectional views of various operations of a process for fabricating a hermetic encapsulation structure according to an embodiment of the invention. FIG. 2A illustrates stack 200 as being similar (but not necessarily identical) to stack 100 of FIG. 1E, wherein stack 200 includes copper panel 202, adhesive layer 204, magnet 206, IC die 208, laminate organic dielectric film 210A, copper filled vias and traces 212, SiN layer 214, and subsequent laminate organic dielectric film layer 210B deposited over stack 100.

Figure 2B:
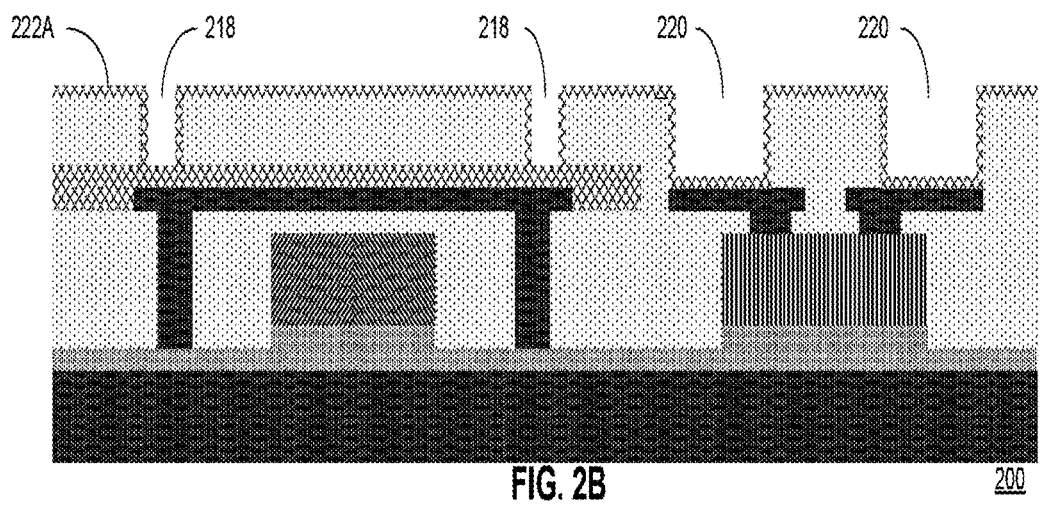
Figure 2C:
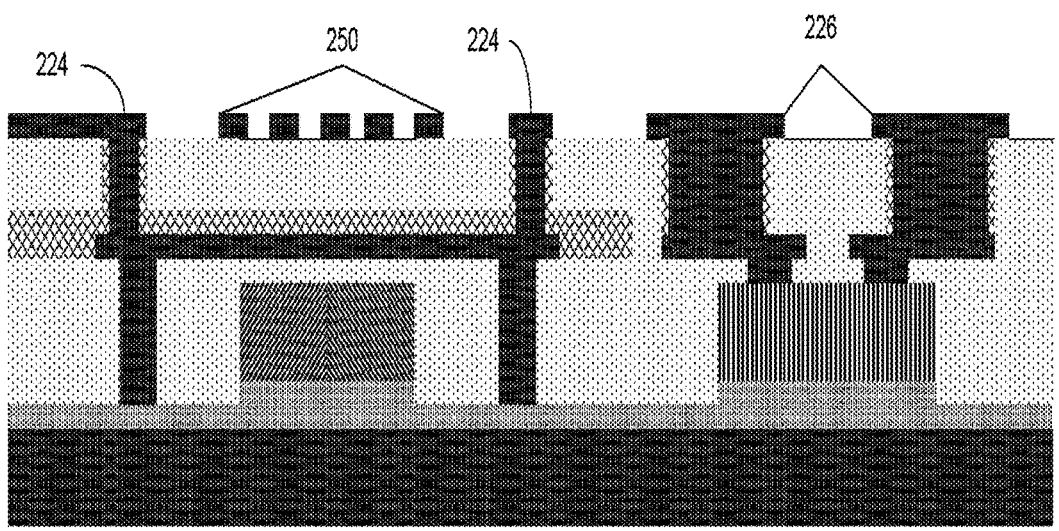

FIG. 2B illustrates vias 218 and 220 formed from a via hole drilling process, and SiN layer 222A deposited over stack 200. SiN layer 222A is shown to partially fill vias 218 and 220. FIG. 2C illustrates stack 200 after an SiN etch process (e.g., an anisotropic dry etch) is performed to remove some of SiN layer 222A of FIG. 2B. MEMS layer 250 and copper vias and pads 224 and 226 are formed via an electroplating process.

Figure 2D:
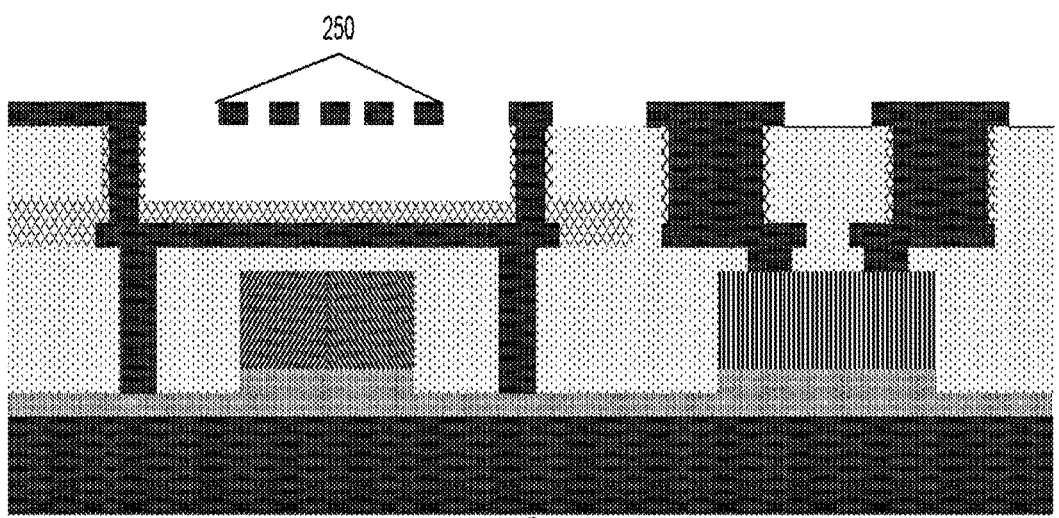
Figure 2E:
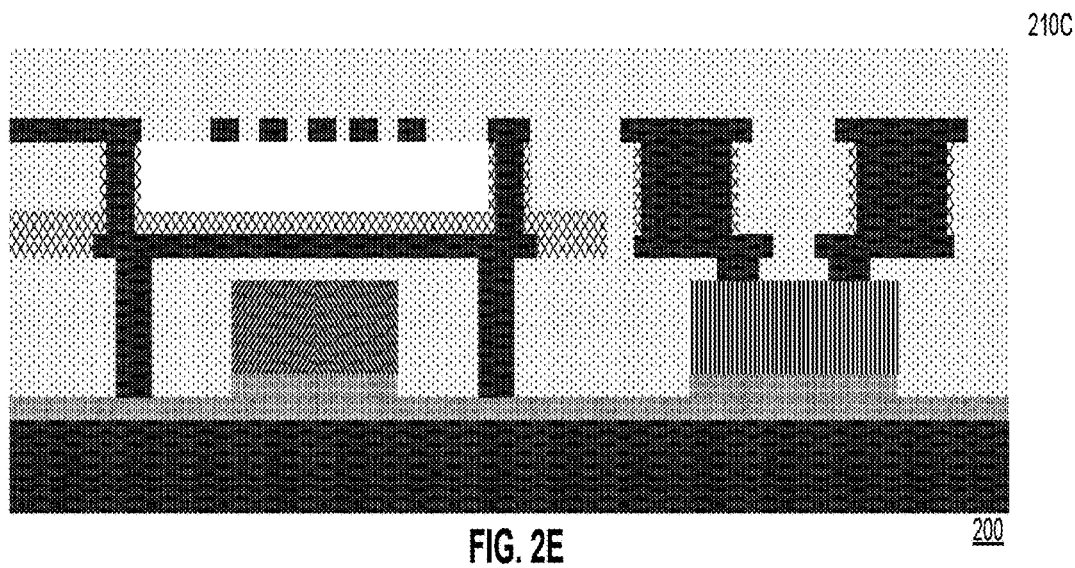

FIG. 2D illustrates a reactive ion etching or oxygen plasma release process is performed to remove a portion of the organic dielectric film layers to release MEMS layer 250. FIG. 2E illustrates laminate organic dielectric film 210C is subsequently deposited on stack 200.

Figure 2F:
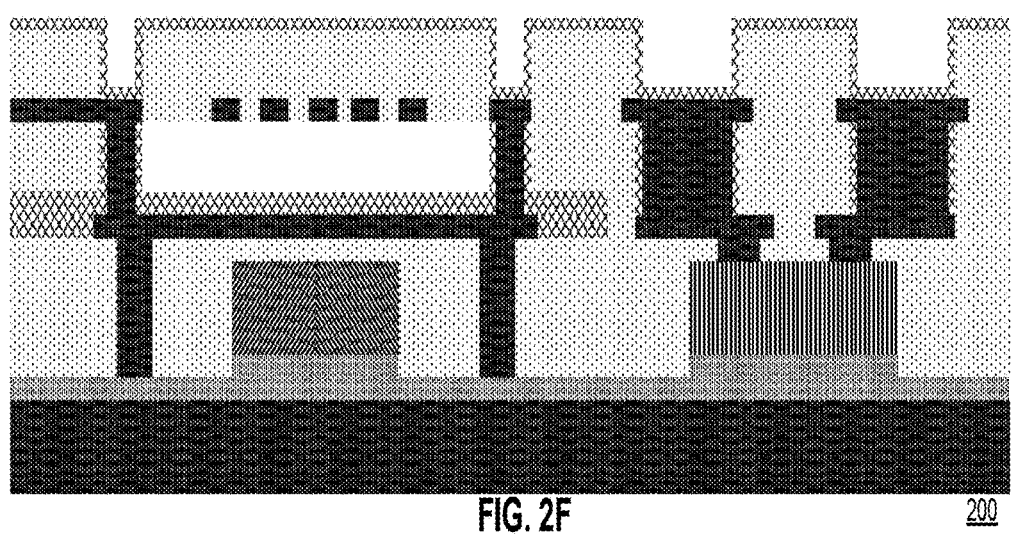
Figure 2G:
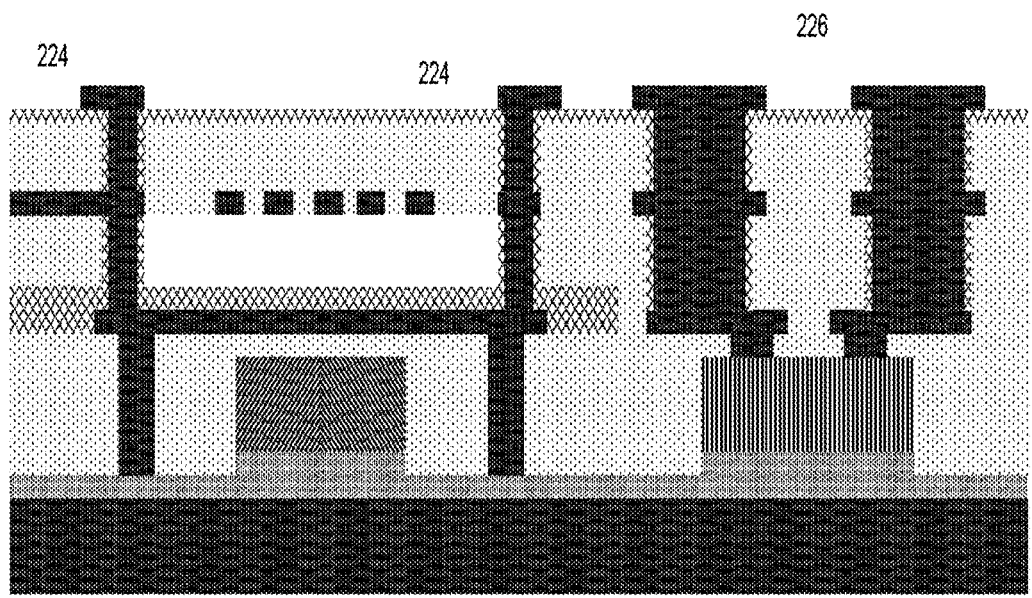

FIG. 2F illustrates a via hole drilling process is performed on stack 200, and additional SiN layer 222B deposition process is performed on stack 200. FIG. 2G illustrates stack 200 after an SiN etch process (e.g., an anisotropic dry etch) is performed to remove some of the previously deposited SiN layer to extend copper pads 224 and 226.

Figure 2H:
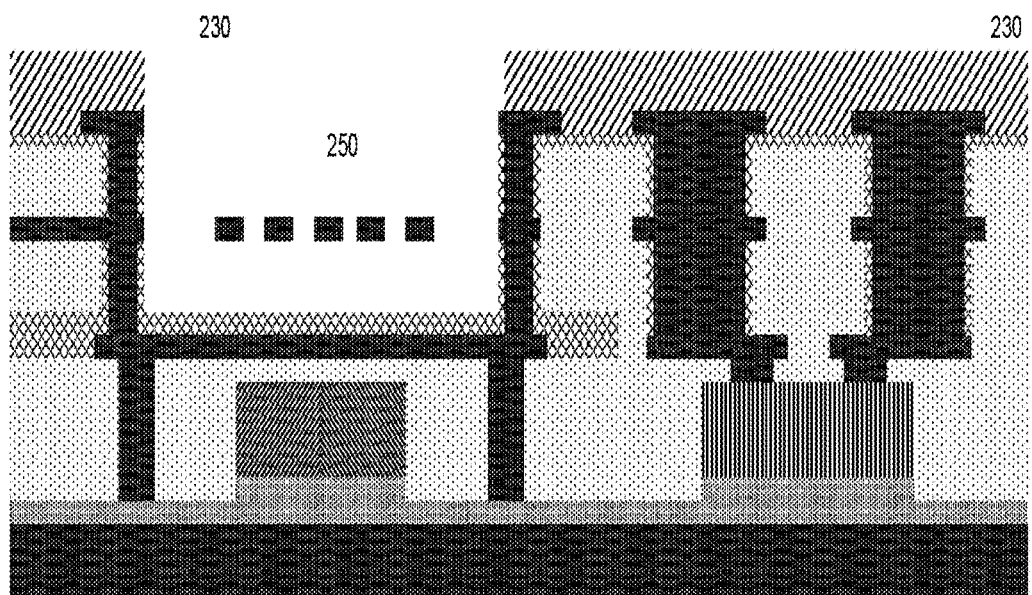
Figure 2I:
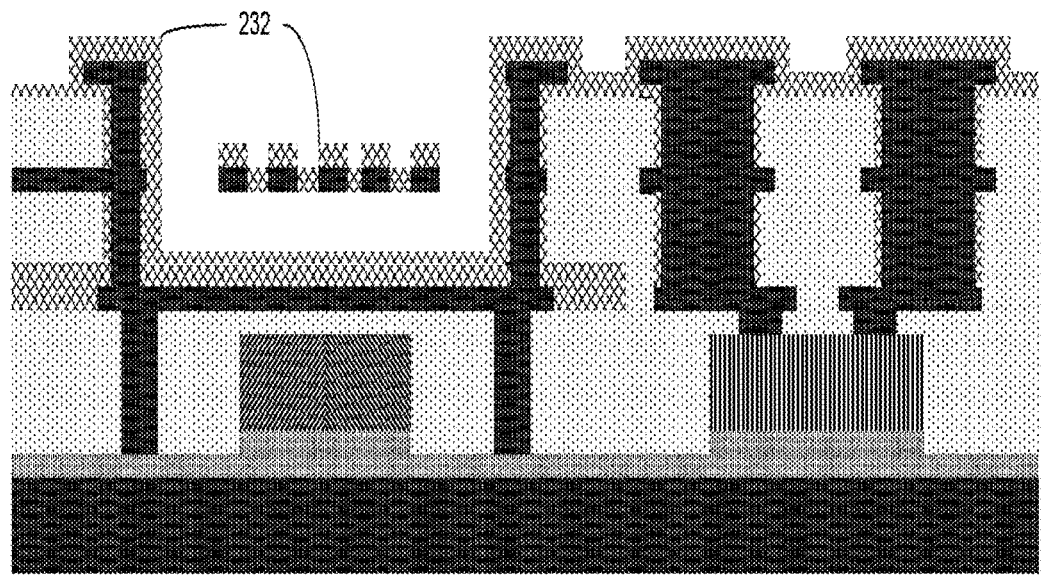
Figure 2J:
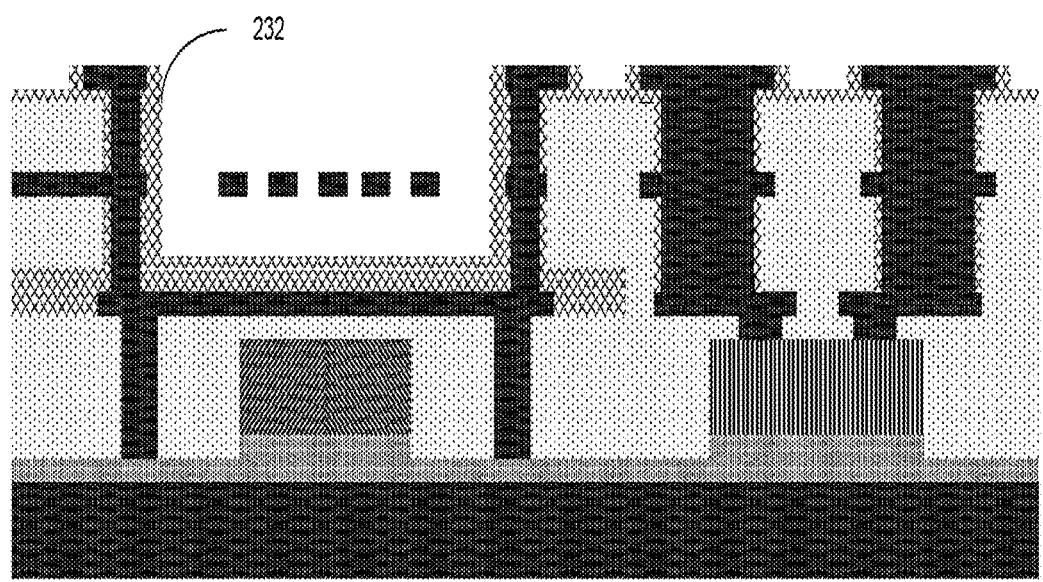

FIG. 2H illustrates photoresist layer 230 selectively deposited on stack 200 to expose MEMS layer 250 via a reactive ion etch or oxygen plasma release process. FIG. 2I illustrates stack 200 after stripping photoresist layer 230 of FIG. 2G and depositing SiN layer 232. FIG. 2J illustrates stack 200 after an SiN etch process (e.g., an anisotropic dry etch) is performed to remove some of SiN layer 232.

Figure 2K:
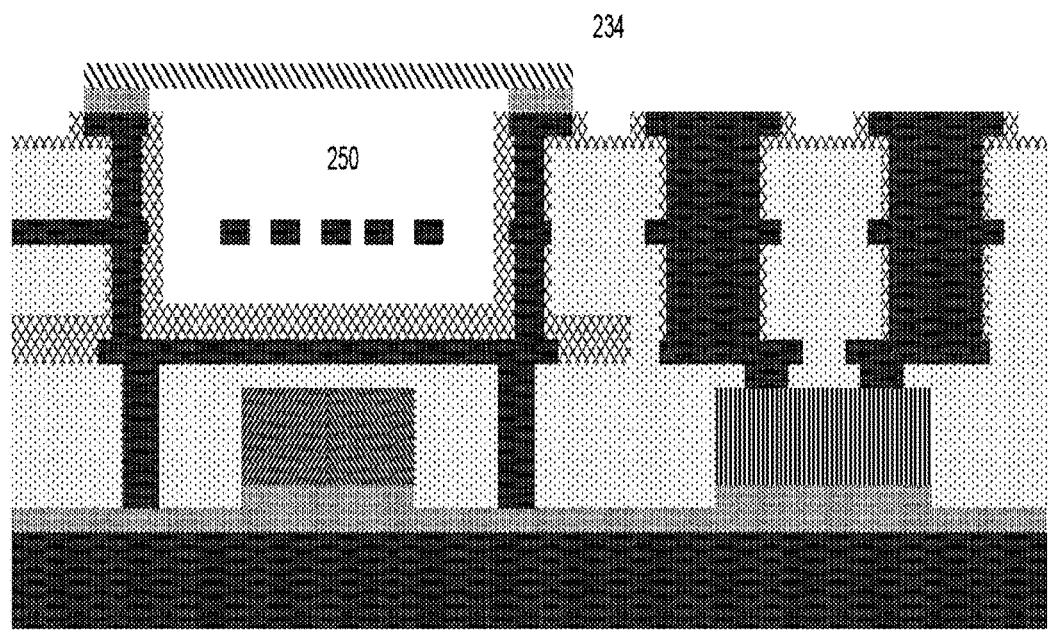
Figure 2L:
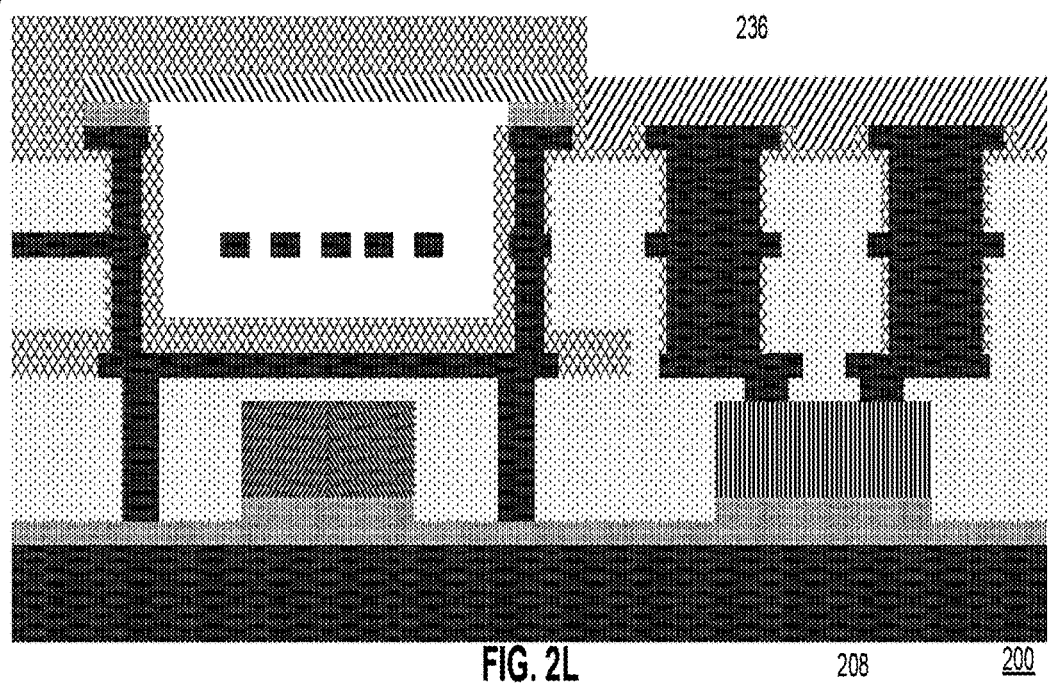

FIG. 2K illustrates metal plate 234 attached/bonded to stack 200 over MEMS layer 250 to provide capping for the MEMS layer. FIG. 2L illustrates photoresist layer 236 is deposited over (the stack buildup of) IC die 208, to protect this region of stack 200 from SiN deposited layer 238.

Figure 2M:
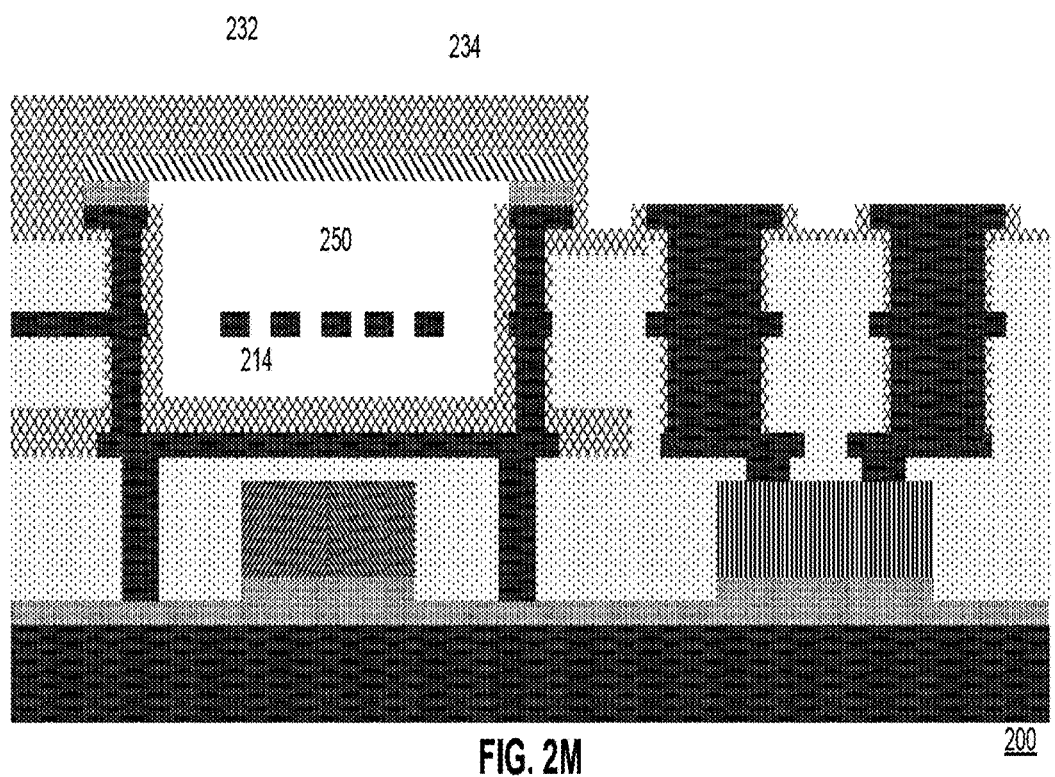

FIG. 2M illustrates stack 200 after photoresist layer 236 of FIG. 2L is removed from the stack. As illustrated in this embodiment, MEMS layer 250 is hermetically encapsulated from any organic layers via SiN layers 214, 232, and metal plate 234.

Figure 3A:
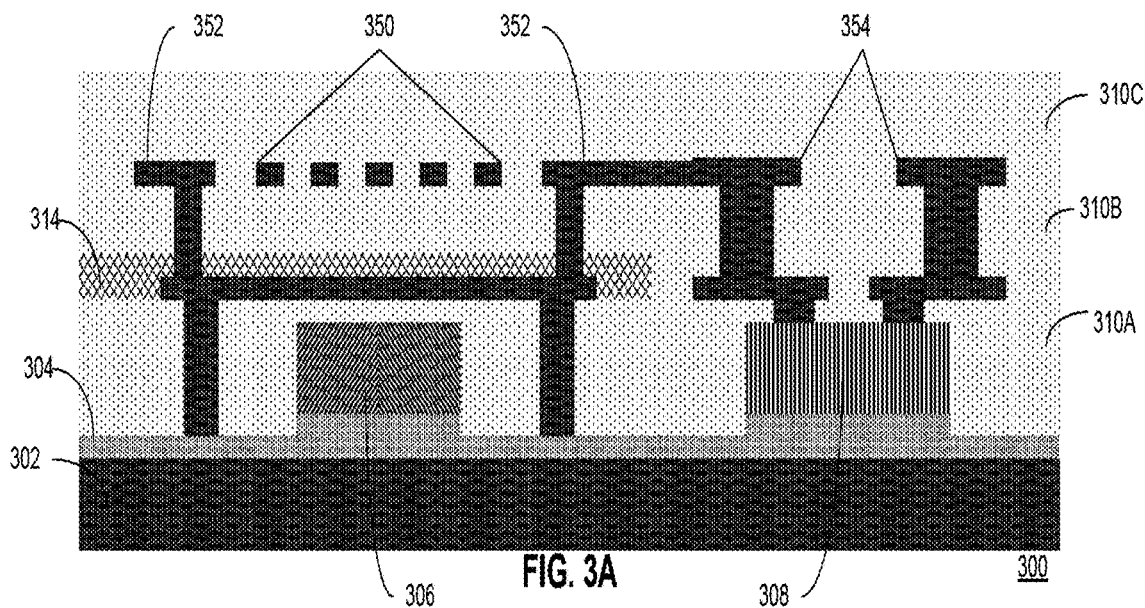
FIG. 3A-3F illustrate cross-sectional views of various operations of a process for fabricating a hermetic encapsulation structure according to an embodiment of the invention.

FIG. 3A-3F illustrate cross-sectional views of various operations of a process for fabricating a hermetic encapsulation structure according to an embodiment of the invention. FIG. 3A illustrates stack 300 as being similar (but not necessarily identical) to stack 100 of FIG. 1G, wherein stack 300 includes copper panel 302, adhesive layer 304, magnet 306, IC die 308, laminate organic dielectric film 310A, SiN layer 314, subsequent laminate organic dielectric film layer 310B deposited over stack 300, MEMS layer 350 and copper pads and traces 352 and 354 formed from a via hole drilling and electroplating processes, and subsequent laminate organic dielectric film layer 310C deposited over stack 300.

Figure 3B:
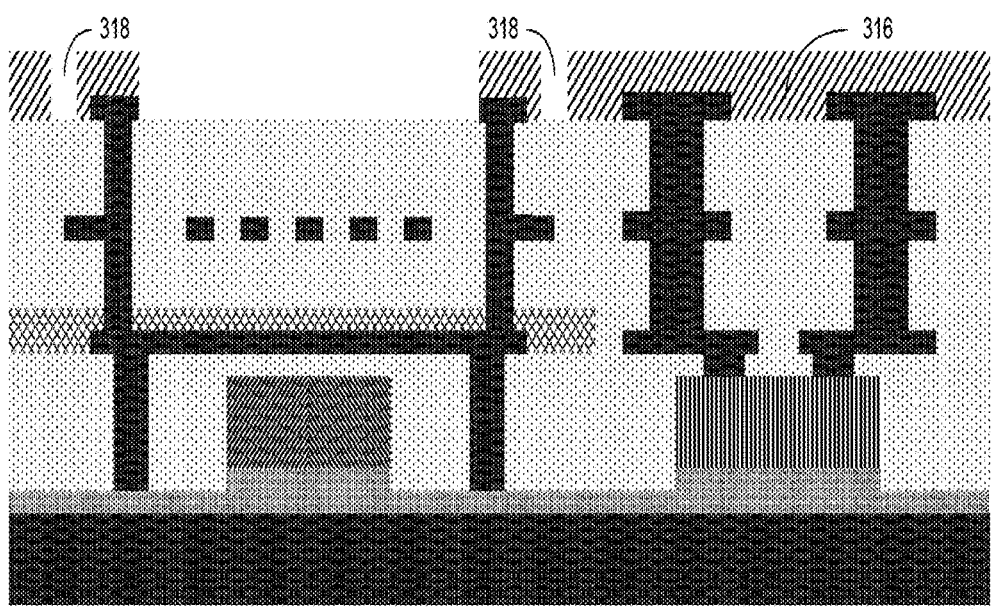
Figure 3C:
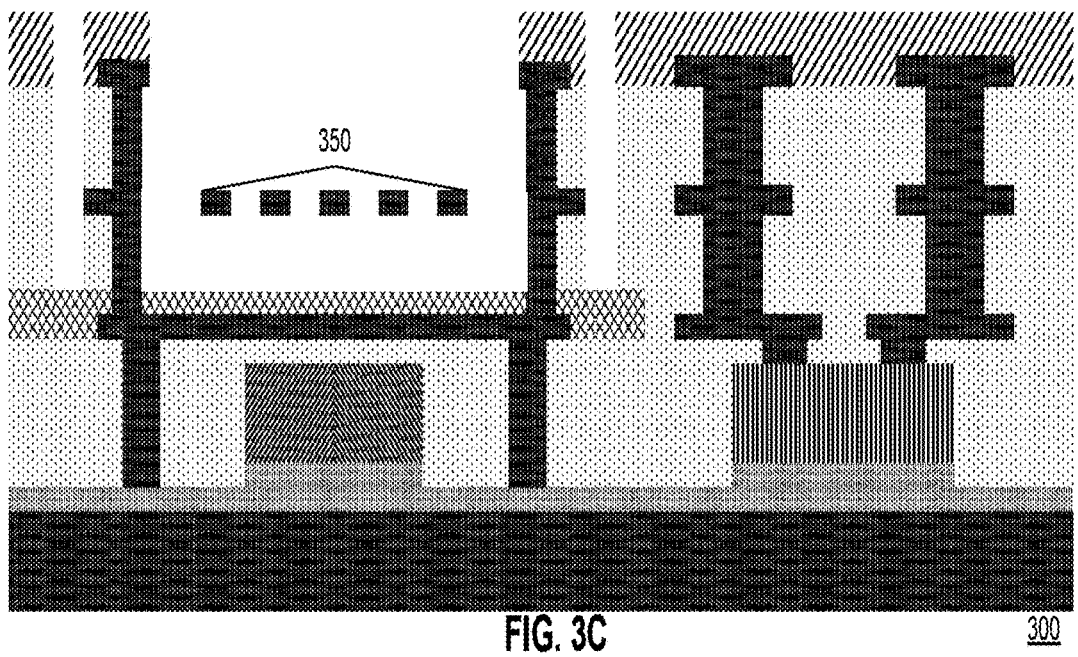

FIG. 3B illustrates photo resist layer 316 is deposited over stack 300, wherein voids 318 are formed. FIG. 3C illustrates a reactive ion etching or oxygen plasma release process is performed to remove a portion of the organic dielectric film layers to release MEMS layer 350 and extend voids 318 into the dielectric layer.

Figure 3D:
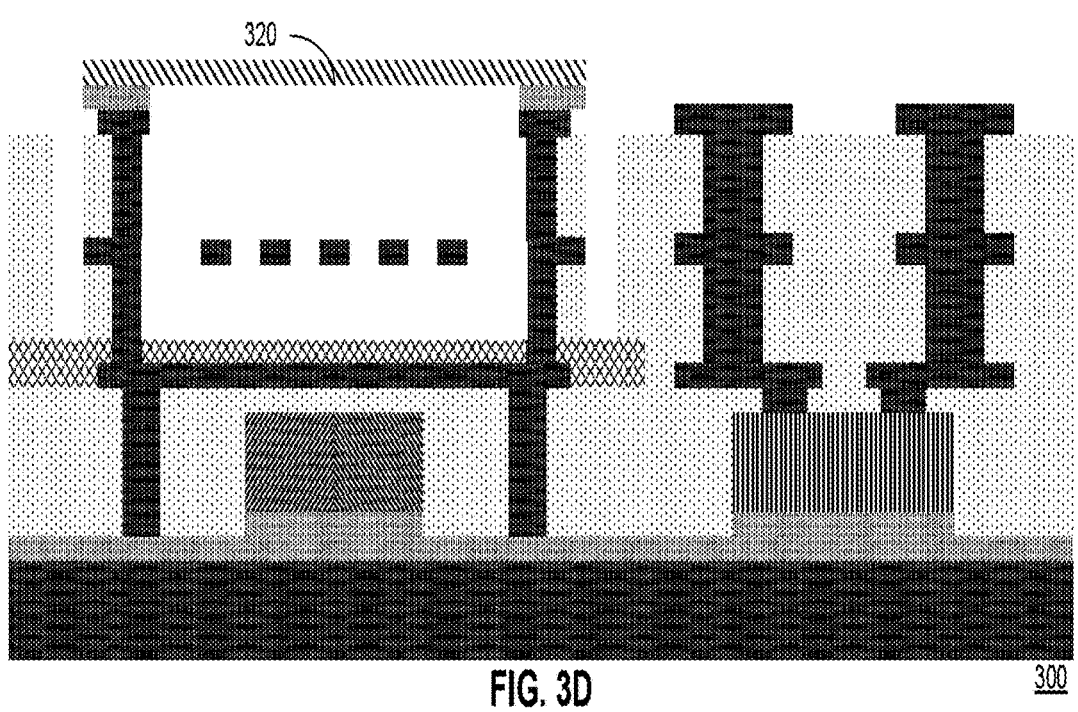
Figure 3E:
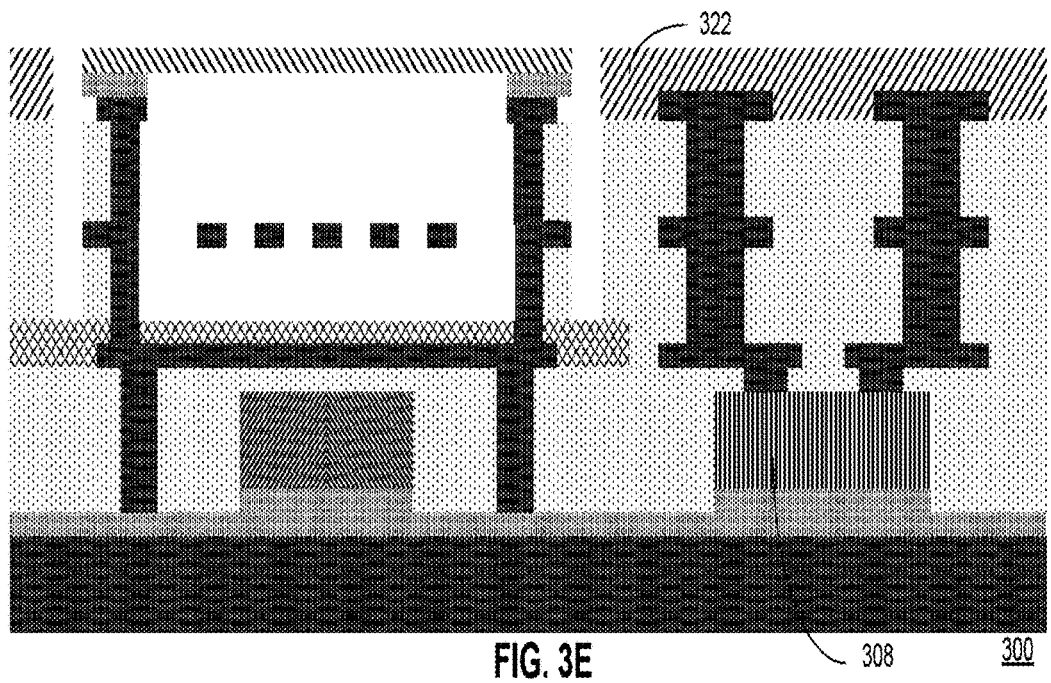

FIG. 3D illustrates stack 300 after photo resist layer 316 of FIG. 3B is stripped, and metal plate 320 is bonded/attached over MEMS layer 350 to provide capping of the MEMS layer. FIG. 3E illustrates photoresist layer 322 is deposited over (the stack buildup of) IC die 308.

Figure 3F:
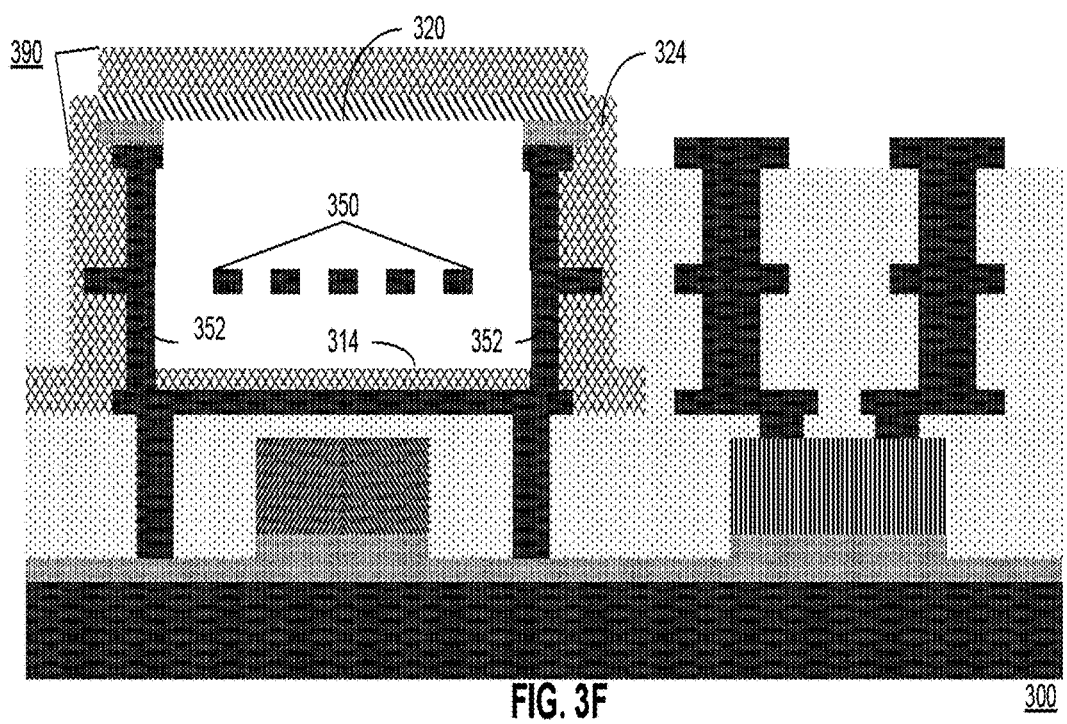

As shown in this embodiment, MEMS layer 350 is hermetically encapsulated from any organic layers via SiN layer 314, metal plate 320, and copper pads/posts 352. FIG. 3F illustrates SiN layer 324 deposited over stack 300 to form "guard ring" 390 over MEMS layer 350 of stack 300. As referred to herein, "guard rings" describe any structure fabricated along the perimeter or portion of the MEMS substrate (such as the portion including the MEMS device) to prevent delamination of the various layers or other edge damage during subsequent process steps (such as separating or singulation (i.e., dicing) multiple MEMS devices from a shared wafer substrate). This continuous via ring may be fabricated for MEMS-based packaging.

Figure 4A:
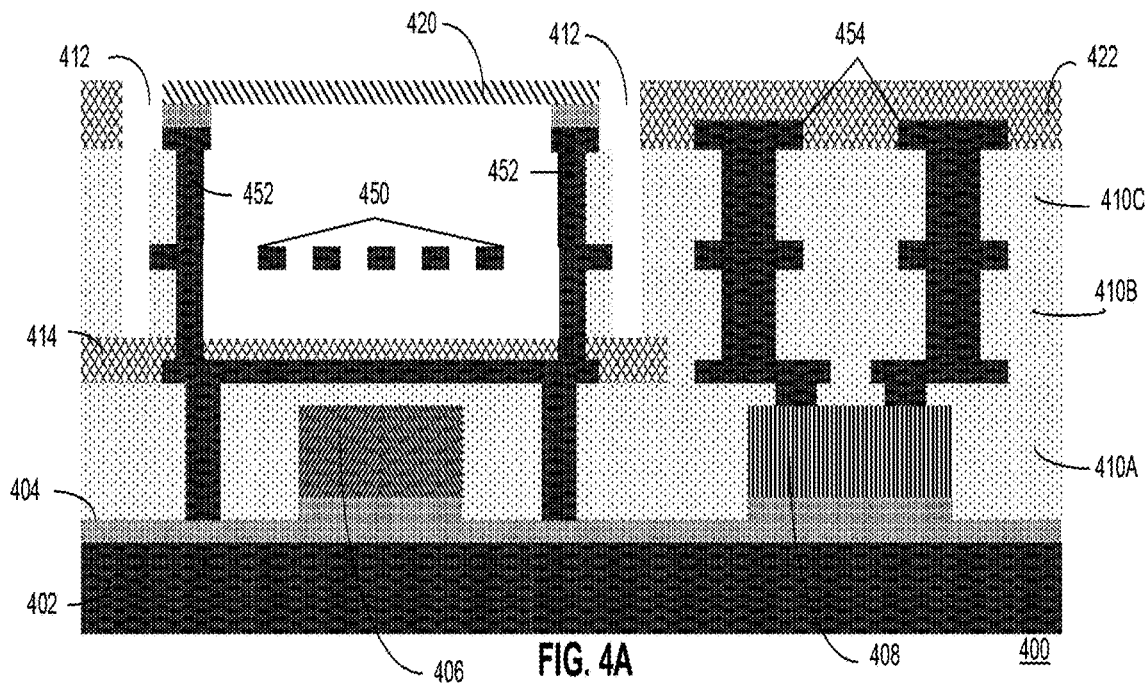
FIG. 4A-4B illustrate cross-sectional views of various operations of a process for fabricating a hermetic encapsulation structure according to an embodiment of the invention.
Figure 4B:
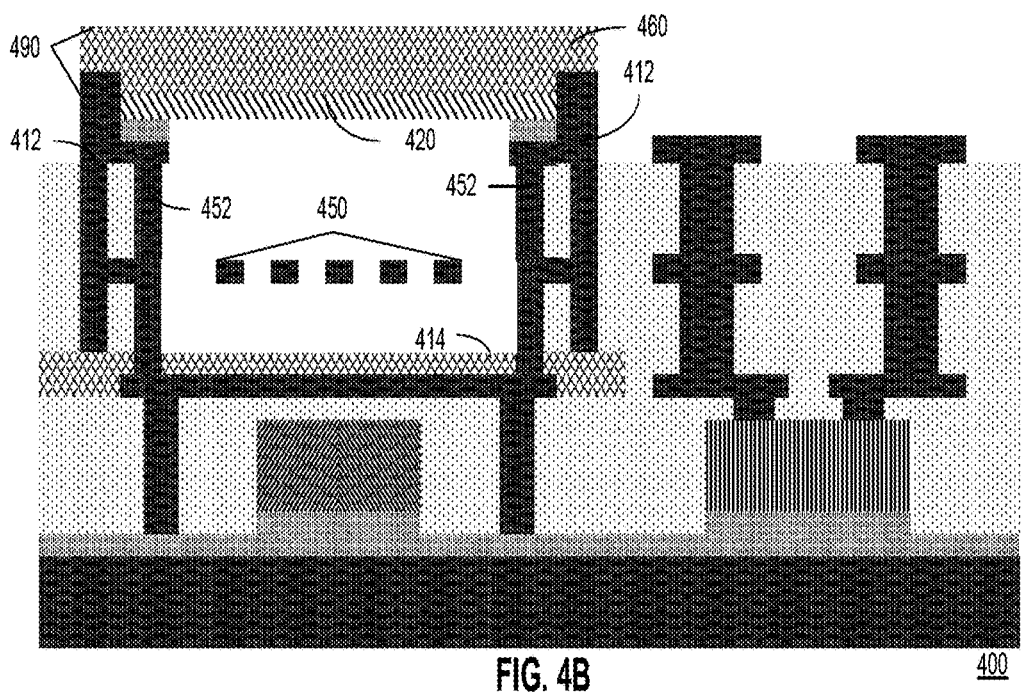

FIG. 4A-4B illustrate cross-sectional views of various operations of a process for fabricating a hermetic encapsulation structure according to an embodiment of the invention. FIG. 4A illustrates stack 400 is being similar (but not necessarily identical to) stack 300 of FIG. 3D, wherein stack 400 includes copper panel 402, adhesive layer 404, magnet 406, IC die 408, laminate organic dielectric film 410A, SiN layer 414, subsequent laminate organic dielectric film layer 410B deposited over stack 400, MEMS layer 450 and copper pads/posts 452 and 454 formed from a via hole drilling and electroplating processes, and subsequent laminate organic dielectric film layer 410C deposited over stack 400, metal plate 420, and photoresist layer 422 is deposited over (the stack buildup of) IC die 408. Vias 412 are shown to be formed outside of copper pads/posts 452.

FIG. 4B illustrates hermetic structure for MEMS layer 450 is comprised of copper sides 452, a bottom layer formed from SiN layer 414, and a top layer formed from metal plate 420. Vias 412 are filled via an electroplating process, and SiN layer 460 is deposited over metal plate 420 to form a copper/SiN guard ring structure 490.

Figure 5A:
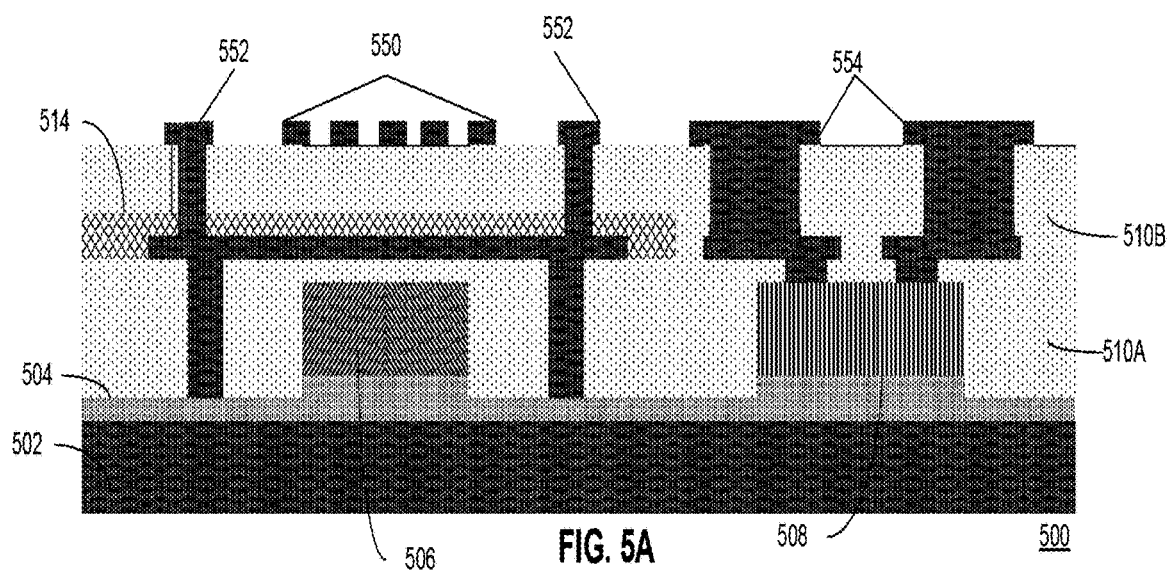
FIG. 5A-5E illustrate cross-sectional views of various operations of a process for fabricating a hermetic encapsulation structure according to an embodiment of the invention.

FIG. 5A-5E illustrate cross-sectional views of various operations of a process for fabricating a hermetic encapsulation structure according to an embodiment of the invention. FIG. 5A illustrates stack 500 as being similar (but not necessarily identical) to stack 100 of FIG. 1F wherein stack 500 includes copper panel 502, adhesive layer 504, magnet 506, IC die 508, laminate organic dielectric film 510A, SiN layer 514, subsequent laminate organic dielectric film layer 510B deposited over stack 500, MEMS layer 550 and copper pads and traces 552 and 554 formed from an electroplating processes.

Figure 5B:
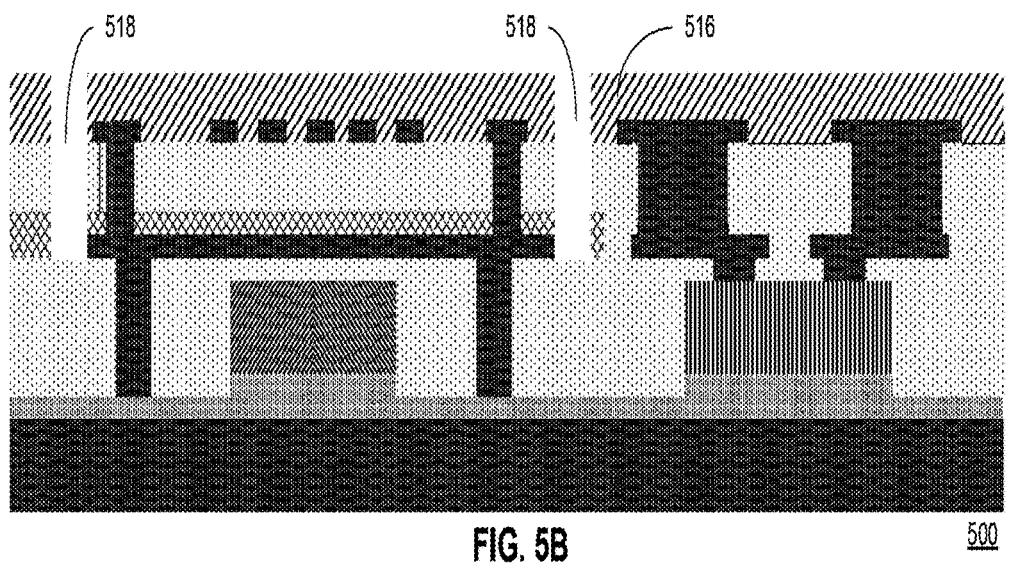
Figure 5C:
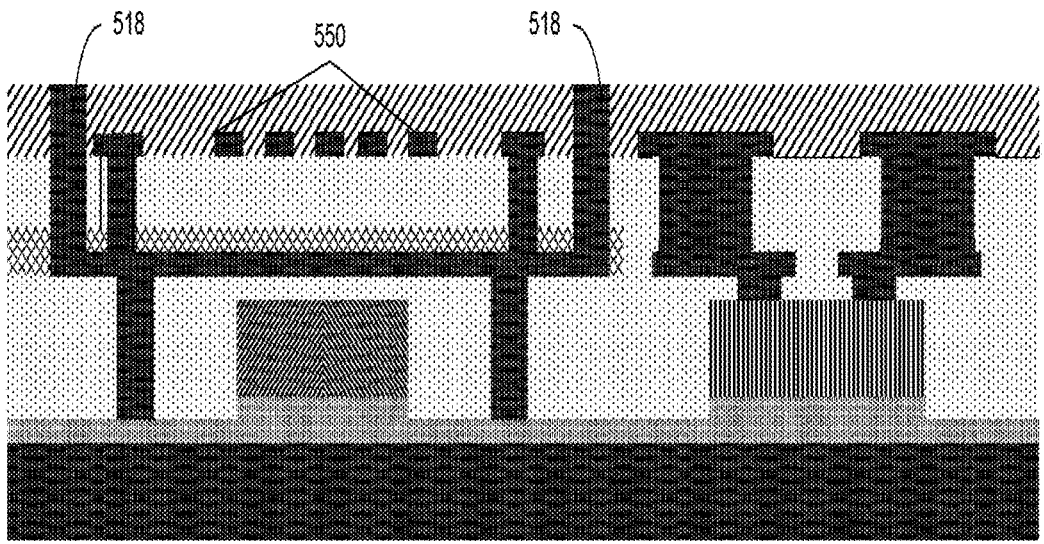
Figure 5D:
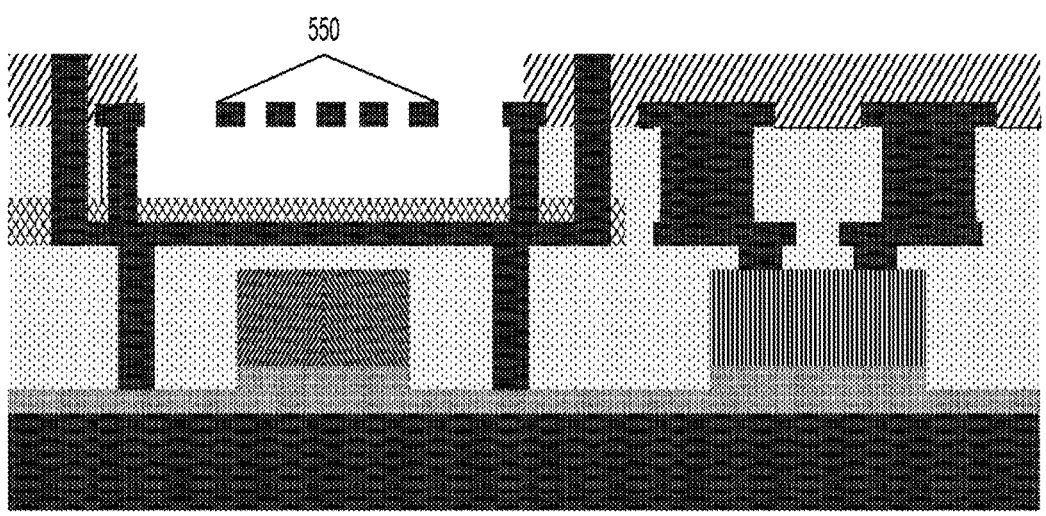

FIG. 5B illustrates photo resist layer 516 deposited over stack 500, wherein voids 518 are created to form a guard ring trench. FIG. 5C illustrates stack 500 having guard ring trench 518 filled by an electroplating processes. FIG. 5D illustrates that a portion of photoresist layer 516 of FIG. 5C is removed, and a reactive ion etching or oxygen plasma release process is performed on stack 500 to remove a portion of the organic dielectric film layers to release MEMS layer 550.

Figure 5E:
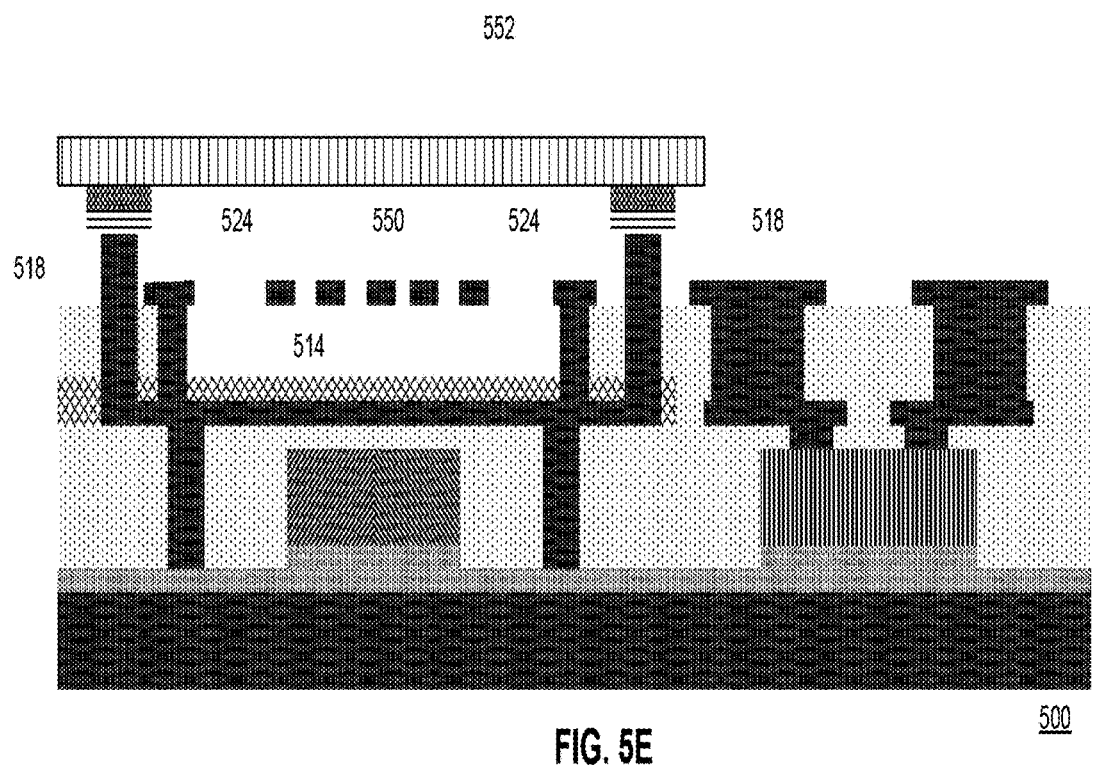

FIG. 5E illustrates stack 500 after the remaining portion of photoresist layer 516 of FIG. 5D is stripped, and external hermetic layer 552 is attached over MEMS layer 550 using, for example, soldering or a thermal conductive bonding process. Hermetic layer 552 may comprise any hermetic material, such as glass or silicon. In this embodiment, the hermetic structure for MEMS layer 550 is comprised of copper sides 524 and 518, a bottom layer formed from SiN layer 514, and a top layer formed from external hermetic layer 552. In some embodiments, hermetic layer 552 may comprise a non-metal material, and may be bonded to the filled guard ring trench via a hermetic solder material (e.g., metal solder, glass solder, etc.), as opposed to the other exemplary embodiments discussed above.

Thus, the above exemplary process flows describe processes to create hermetic encapsulation for MEMS devices. In each of these embodiments, a MEMS substrate stack is to comprise a magnet, a first laminate organic dielectric film, a first SiN layer disposed over the magnet, a second laminate organic dielectric film disposed on SiN layer, a MEMS device layer disposed over the magnet, and a plurality of metal interconnects surrounding the MEMS device layer. A hermetic plate is subsequently bonded to the MEMS substrate stack and disposed over the formed MEMS device layer to at least partially form a hermetically encapsulated cavity surrounding the MEMS device layer. In the various embodiments described above, the hermetically encapsulated cavity is further formed from the first SiN layer, and at least one of the set of metal interconnects, or a second SiN layer deposited onto the set of metal interconnects.

Figure 6:
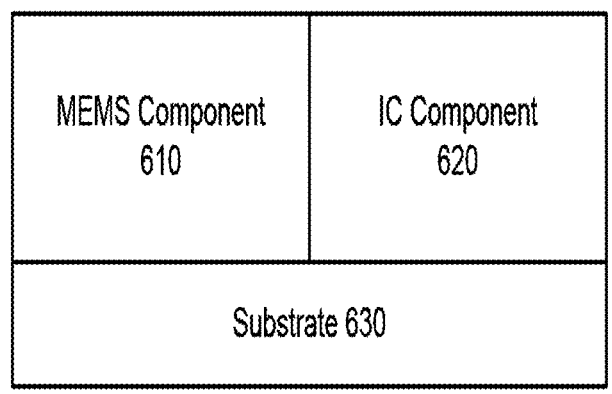
FIG. 6 is a block diagram of a device having a microelectromechanical systems component and an integrated circuit component according to an embodiment of the invention.

FIG. 6 is a block diagram of a device having a MEMS component and an IC component according to an embodiment of the invention. In this embodiment, device 600 includes MEMS component 610 and IC component 620, which are both disposed on substrate 630 (e.g., both components may be formed from said substrate, bonded to said substrate, etc.).

MEMS component 610 may comprise any of the hermetically encapsulated MEMS structures described above. The moving components of MEMS component 610 may interact with IC component 620 during its operation. For example, MEMS component 610 may comprise an array of cantilever probe tips that write on IC component 620, which may comprise a phase change memory medium. In other embodiments, IC component 620 may comprise flash memory cells (e.g., NAND flash, NOR flash) and MEMS component 610 may comprise mechanical structures to charge/discharge said memory cells. In other embodiments, MEMS component 610 and IC component 620 may comprise any mechanical/IC combinational device.

Figure 7:
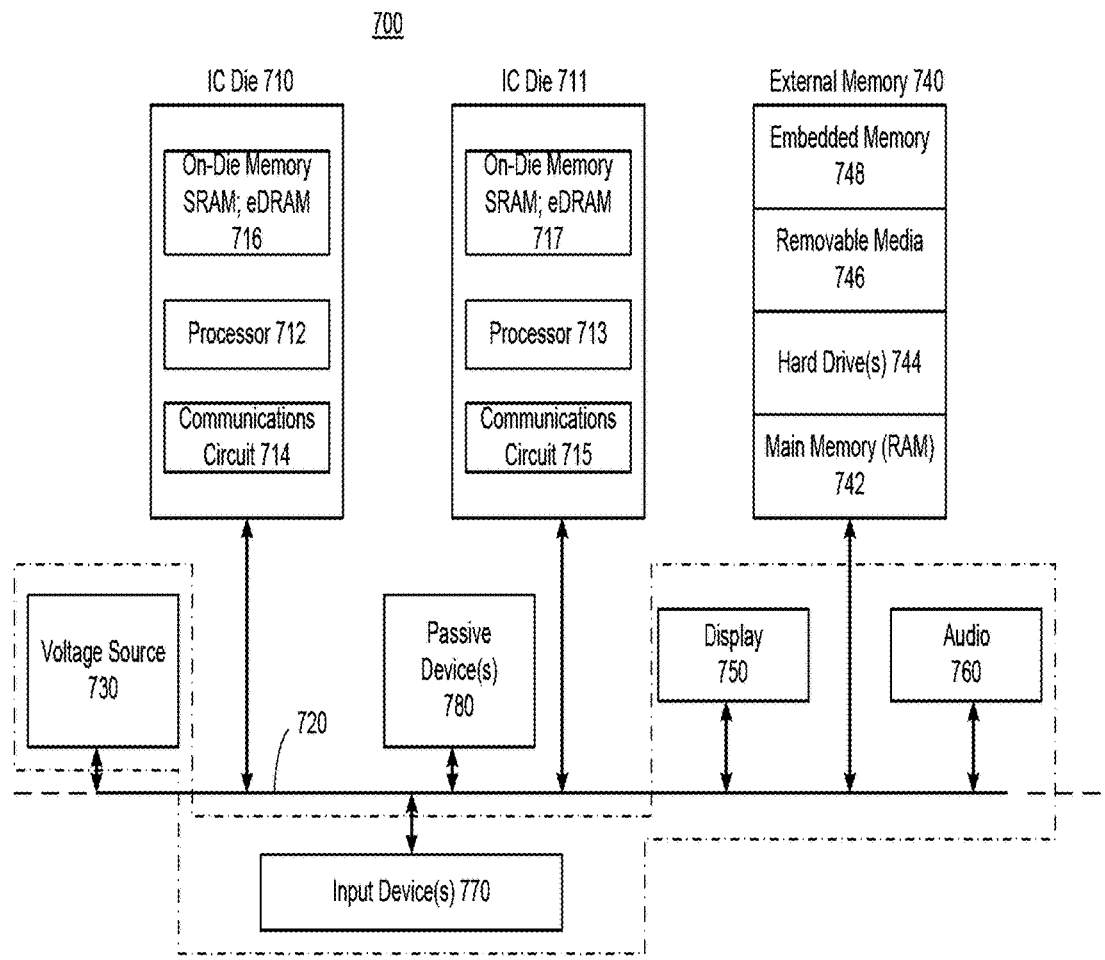
FIG. 7 is an illustration of a computer system to utilize an embodiment of the invention.

FIG. 7 is an illustration of a computer system to utilize an embodiment of the invention. Computer system 700 (also referred to as the electronic system 700) as depicted may embody a semiconductor package having a hermetically encapsulated MEMS device as described above. Computer system 700 may be a mobile device such as a netbook computer. Computer system 700 may be a mobile device such as a wireless smart phone. Computer system 700 may be a desktop computer. The computer system 700 may be a hand-held reader. Computer system 700 may be a wearable computing device.

In an embodiment, system 700 is a computer system that includes system bus 720 to electrically couple the various components of the electronic system. System bus 720 is a single bus or any combination of busses according to various embodiments. System 700 includes voltage source 730 that provides power to integrated circuit 710. In some embodiments, the source 730 supplies current to integrated circuit 710 through system bus 720.

Integrated circuit 710 is electrically coupled to system bus 720 and includes any circuit, or combination of circuits according to an embodiment. In an embodiment, integrated circuit 710 includes processor 712 that can be of any type. As used herein, processor 712 may mean any type of circuit such as, but not limited to, a microprocessor, a microcontroller, a graphics processor, a digital signal processor, or another processor. In an embodiment, processor 712 includes or is included in a semiconductor package having a hermetically encapsulated MEMS device, as disclosed herein. In an embodiment, SRAM embodiments are found in memory caches of the processor. Other types of circuits that can be included in integrated circuit 710 are a custom circuit or an application-specific integrated circuit (ASIC), such as communications circuit 714 for use in wireless devices such as cellular telephones, smart phones, pagers, portable computers, two-way radios, and similar electronic systems. In an embodiment, processor 710 includes on-die memory 716 such as static random-access memory (SRAM). In an embodiment, processor 710 includes embedded on-die memory 716 such as embedded dynamic random-access memory (eDRAM).

In an embodiment, integrated circuit 710 is complemented with subsequent integrated circuit 711. Useful embodiments include dual processor 713 and dual communications circuit 715 and dual on-die memory 717 such as SRAM. In an embodiment, dual integrated circuit 710 includes embedded on-die memory 717 such as eDRAM.

In an embodiment, electronic system 700 also includes an external memory 740 that in turn may include one or more memory elements suitable to the particular application, such as main memory 742 in the form of RAM, one or more hard drives 744, and/or one or more drives that handle removable media 746, such as diskettes, compact disks (CDs), digital variable disks (DVDs), flash memory drives, and other removable media known in the art. External memory 740 may also be embedded memory 748 such as the first die in an embedded TSV die stack, according to an embodiment.

In an embodiment, electronic system 700 also includes display device 750 and audio output 760. In an embodiment, electronic system 700 includes an input device such as controller 770 that may be a keyboard, mouse, trackball, game controller, microphone, voice-recognition device, or any other input device that inputs information into electronic system 700. In an embodiment, input device 770 is a camera. In an embodiment, input device 770 is a digital sound recorder. In an embodiment, input device 770 is a camera and a digital sound recorder.

As shown herein, integrated circuit 710 may be implemented in a number of different embodiments, including a semiconductor package having a hermetically encapsulated MEMS device according to any of the several disclosed embodiments and their equivalents, an electronic system, a computer system, one or more methods of fabricating an integrated circuit, and one or more methods of fabricating an electronic assembly that includes a semiconductor package having a hermetically encapsulated MEMS device according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor package having hermetically encapsulated MEMS device embodiments and their equivalents. A foundation substrate may be included, as represented by the dashed line of FIG. 7. Passive devices 780 may also be included, as is also depicted in FIG. 7.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment," "an embodiment," "one or more embodiments," or "different embodiments," for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

Embodiments of the invention describe an apparatus including a microelectromechanical systems (MEMS) substrate stack comprising a magnet, a first laminate organic dielectric film, a first hermetic coating disposed over a portion of the substrate stack, a second laminate organic dielectric film disposed on the first hermetic coating, a MEMS device layer disposed over the magnet, and a plurality of metal interconnects surrounding the MEMS device layer. The apparatus further comprises a hermetic plate bonded to the MEMS substrate stack and disposed over the formed MEMS device layer to at least partially form a hermetically encapsulated cavity surrounding the MEMS device layer. In embodiments of the invention, the hermetically encapsulated cavity is further formed from the first hermetic coating, and at least one of the set of metal interconnects, or a second hermetic coating deposited onto the set of metal interconnects.

In some embodiments, the hermetically encapsulated cavity is further formed from the set of metal interconnects, and the MEMS substrate stack further comprises the second hermetic coating disposed over the hermetic structure and at least partially filling a plurality of voids etches around the metal interconnects.

In some embodiments, the hermetically encapsulated cavity is further formed from the second hermetic coating deposited onto the set of metal interconnects, wherein the second hermetic coating is deposited on to the MEMS layer and the plurality of metal interconnects prior to bonding the hermetic plate over the formed MEMS device layer.

In some embodiments, the hermetically encapsulated cavity is further formed from the set of metal interconnects, and the MEMS substrate stack further comprises a guard ring formed from the second hermetic coating and a plurality of via holes on the MEMS substrate stack around the MEMS layer and the set of metal interconnects, wherein the second hermetic coating is deposited over the hermetic structure and is to fill the formed guard ring.

In some embodiments, the hermetically encapsulated cavity is further formed from the set of metal interconnects, and the MEMS substrate stack further comprises an electroplated filled guard ring trench formed from a plurality of via holes on the MEMS substrate stack around the MEMS layer and the set of metal interconnects. In some of these embodiments, the hermetically encapsulated cavity is further formed from the filled guard ring trench.

In some embodiments, the hermetic coating comprises at least one of silicon nitride (SiN), SiN derivatives, silicon dioxide (SiO2) or silicon oxynitride (SiON). In some embodiments, the hermetic plate comprises at least one of metal, silicon, glass, or a mesh layer. In some embodiments, the MEMS substrate stack further comprises an integrated circuit (IC) die.

Embodiments of the invention describe processes including operations for depositing a first laminate organic dielectric film on a microelectromechanical systems (MEMS) substrate stack, the stack to include a magnet, depositing a first hermetic coating over a portion of the MEMS substrate stack, depositing a second laminate organic dielectric film on the first hermetic coating, forming a MEMS device layer over the magnet of the MEMS substrate stack and a plurality of metal interconnects surrounding the MEMS device layer, removing a section of the second laminate organic dielectric film surrounding the MEMS layer, and bonding a hermetic plate over the formed MEMS device layer to at least partially form a hermetically encapsulated cavity surrounding the MEMS device layer. In embodiments of the invention, the hermetically encapsulated cavity is further formed from the first hermetic coating, and at least one of the set of metal interconnects, or a second hermetic coating deposited onto the set of metal interconnects.

In some embodiments, the hermetically encapsulated cavity is further formed from the set of metal interconnects, and the processes include operations for performing an etch around the metal interconnects to create a plurality of voids, and depositing the second hermetic coating over the MEMS device layer over the hermetic structure and at least partially filling the voids.

In some embodiments, the hermetically encapsulated cavity is further formed from the second hermetic coating deposited onto the set of metal interconnects, and the processes include operations for depositing the second hermetic coating on to the MEMS layer and the plurality of metal interconnects prior to bonding the hermetic plate over the formed MEMS device layer.

In some embodiments, the hermetically encapsulated cavity is further formed from the set of metal interconnects, and the processes include operations for forming a plurality of via holes on the MEMS substrate stack to form a guard ring around the MEMS layer and the set of metal interconnects, and depositing the second hermetic coating over the MEMS device layer over the hermetic structure and to fill the formed guard ring.

In some embodiments, the hermetically encapsulated cavity is further formed from the set of metal interconnects, and the processes include operations for forming a plurality of via holes on the MEMS substrate stack to form a guard ring around the MEMS layer and the set of metal interconnects, and depositing a plating layer to fill the formed guard ring.

In some embodiments, the hermetically encapsulated cavity is further formed from the set of metal interconnects, and the processes include operations for forming a plurality of via holes on the MEMS substrate stack to form a guard ring trench around the MEMS layer and the set of metal interconnects, and depositing a plating layer to fill the formed guard ring trench, wherein the hermetically encapsulated cavity is further formed from the filled guard ring trench. In these embodiments, the hermetic plate comprises a nonmetal material and is bonded to the filled guard ring trench via a hermetic solder material.

In some embodiments, the hermetic coating comprises at least one of silicon nitride (SiN), SiN derivatives, silicon dioxide (SiO2) or silicon oxynitride (SiON). In some embodiments, the hermetic plate comprises at least one of metal, silicon, glass, or a mesh layer. In some embodiments, the MEMS substrate stack further comprises an integrated circuit (IC) die.

The invention claimed is:
1. An apparatus comprising:
a microelectromechanical systems (MEMS) substrate stack comprising:
  a magnet affixed to a surface of a substrate;
  a first laminate organic dielectric film formed over the substrate and the magnet;
  a first hermetic coating disposed over a portion of the substrate stack;
  a second laminate organic dielectric film disposed on the first hermetic coating;
  a MEMS device layer disposed over the magnet; and
  a plurality of metal interconnects surrounding the MEMS device layer; and
a hermetic plate bonded to at least one of the metal interconnects surrounding the MEMS substrate stack and disposed over the formed MEMS device layer to at least partially form a hermetically encapsulated cavity surrounding the MEMS device layer;
wherein the hermetically encapsulated cavity is further formed from the first hermetic coating, and at least one of:
  the set of metal interconnects; or
  a second hermetic coating deposited onto sidewall surfaces of the set of metal interconnects.

2. The apparatus of claim 1, wherein the hermetically encapsulated cavity is further formed from the set of metal interconnects, and the MEMS substrate stack further comprises:
the second hermetic coating disposed over the hermetic structure and at least partially filling a plurality of voids around the metal interconnects.

3. The apparatus of claim 1, wherein the hermetically encapsulated cavity is further formed from the second hermetic coating deposited onto the set of metal interconnects, wherein the second hermetic coating is deposited on to the MEMS layer and the plurality of metal interconnects prior to bonding the hermetic plate over the formed MEMS device layer.

4. The apparatus of claim 3, wherein the hermetically encapsulated cavity is further formed from the set of metal interconnects, and the MEMS substrate stack further comprises:
a guard ring formed from the second hermetic coating and a plurality of via holes on the MEMS substrate stack around the MEMS layer and the set of metal interconnects, wherein the second hermetic coating is deposited over the hermetic structure and is to fill the formed guard ring.

5. The apparatus of claim 3, wherein the hermetically encapsulated cavity is further formed from the set of metal interconnects, and the MEMS substrate stack further comprises:
an electroplated filled guard ring trench formed from a plurality of via holes on the MEMS substrate stack around the MEMS layer and the set of metal interconnects.

6. The apparatus of claim 5, wherein the hermetically encapsulated cavity is further formed from the filled guard ring trench.

7. The apparatus of claim 1, wherein the hermetic coating comprises at least one of silicon nitride (SiN), SiN derivatives, silicon dioxide (SiO2) or silicon oxynitride (SiON).

8. The apparatus of claim 1, wherein the hermetic plate comprises at least one of metal, silicon, glass, or a mesh layer.

9. The apparatus of claim 1, wherein the MEMS substrate stack further comprises an integrated circuit (IC) die.

10. A method comprising:
depositing a first laminate organic dielectric film on a microelectromechanical systems (MEMS) substrate stack, the stack to include a magnet affixed to a surface of a substrate;
depositing a first hermetic coating over a portion of the MEMS substrate stack;
depositing a second laminate organic dielectric film on the first hermetic coating;
forming a MEMS device layer over the magnet of the MEMS substrate stack and a plurality of metal interconnects surrounding the MEMS device layer, wherein the MEMS device layer is formed on a top surface of the second laminate organic dielectric film;
removing a section of the second laminate organic dielectric film surrounding the MEMS layer to form a cavity in the second laminate organic dielectric film that contains the MEMS device layer; and
bonding a hermetic plate over the formed MEMS device layer to at least partially hermetically encapsulated the cavity surrounding the MEMS device layer, wherein the hermetically encapsulated cavity is further formed from the first hermetic coating, and at least one of:
the set of metal interconnects; or
a second hermetic coating deposited onto the set of metal interconnects.

11. The method of claim 10, wherein the hermetically encapsulated cavity is further formed from the set of metal interconnects, and the method further comprises:
performing an etch around the metal interconnects to create a plurality of voids; and
depositing the second hermetic coating over the MEMS device layer over the hermetic structure and at least partially filling the voids.

12. The method of claim 10, wherein the hermetically encapsulated cavity is further formed from the second hermetic coating deposited onto the set of metal interconnects, and the method further comprises:
depositing the second hermetic coating on to the MEMS layer and the plurality of metal interconnects prior to bonding the hermetic plate over the formed MEMS device layer.

13. The method of claim 10, wherein the hermetically encapsulated cavity is further formed from the set of metal interconnects, and the method further comprises:
forming a plurality of via holes on the MEMS substrate stack to form a guard ring around the MEMS layer and the set of metal interconnects; and
depositing the second hermetic coating over the MEMS device layer over the hermetic structure and to fill the formed guard ring.

14. The method of claim 10, wherein the hermetically encapsulated cavity is further formed from the set of metal interconnects, and the method further comprises:
forming a plurality of via holes on the MEMS substrate stack to form a guard ring around the MEMS layer and the set of metal interconnects; and
depositing a plating layer to fill the formed guard ring.

15. The method of claim 10, wherein the hermetically encapsulated cavity is further formed from the set of metal interconnects, and the method further comprises:
forming a plurality of via holes on the MEMS substrate stack to form a guard ring trench around the MEMS layer and the set of metal interconnects; and
depositing a plating layer to fill the formed guard ring trench, wherein the hermetically encapsulated cavity is further formed from the filled guard ring trench;
wherein the hermetic plate comprises a non-metal material and is bonded to the filled guard ring trench via a hermetic solder material.

16. The method of claim 10, wherein the hermetic coating comprises at least one of silicon nitride (SiN), SiN derivatives, silicon dioxide (SiO2) or silicon oxynitride (SiON).

17. The method of claim 10, wherein the hermetic plate comprises at least one of metal, silicon, glass, or a mesh layer.

18. The method of claim 10, wherein the MEMS substrate stack further comprises an integrated circuit (IC) die.

* * * * *